United States Patent
Coakley et al.

(10) Patent No.: US 11,108,175 B2
(45) Date of Patent: Aug. 31, 2021

(54) TERMINAL-FREE CONNECTORS AND CIRCUITS COMPRISING TERMINAL-FREE CONNECTORS

(71) Applicant: CelLink Corporation, San Carlos, CA (US)

(72) Inventors: Kevin Michael Coakley, Belmont, CA (US); Malcolm Parker Brown, Mountain View, CA (US); Mark Terlaak, San Carlos, CA (US); Will Findlay, San Carlos, CA (US)

(73) Assignee: CelLink Corporation, San Carlos, CA (US)

( * ) Notice: Subject to any disclaimer, the term of this patent is extended or adjusted under 35 U.S.C. 154(b) by 0 days.

(21) Appl. No.: 16/939,904

(22) Filed: Jul. 27, 2020

(65) Prior Publication Data

US 2021/0021066 A1    Jan. 21, 2021

Related U.S. Application Data

(63) Continuation of application No. PCT/US2020/041829, filed on Jul. 13, 2020.
(Continued)

(51) Int. Cl.
*H01R 3/00* (2006.01)
*H01R 12/61* (2011.01)
(Continued)

(52) U.S. Cl.
CPC ......... *H01R 12/613* (2013.01); *H01R 12/777* (2013.01); *H01R 13/2485* (2013.01); *H01R 13/501* (2013.01)

(58) Field of Classification Search
CPC ..... H01R 12/79; H01R 13/465; H01R 13/684
(Continued)

(56) References Cited

U.S. PATENT DOCUMENTS 3,994,554 A    11/1976 Navarro
4,109,821 A    8/1978 Lutz
(Continued)

FOREIGN PATENT DOCUMENTS

CN    202434735 U    9/2012
DE    102005041265 A1    3/2007
(Continued)

OTHER PUBLICATIONS

International Application Serial No. PCT/US20/41830, Search Report and Written Opinion dated Oct. 15, 2020 9 pgs.
(Continued)

*Primary Examiner* — Phuong Chi Thi Nguyen
(74) *Attorney, Agent, or Firm* — Kwan & Olynick LLP

(57) ABSTRACT

Provided are terminal-free connectors for flexible interconnect circuits. A connector comprises a housing chamber defined by at least a first side wall and a second side wall oppositely positioned about the base. An edge support is positioned at each of the first side wall and the second side wall. The edge supports allow for precise placement of the flexible interconnect circuit inside the housing chamber. A cover piece is coupled to the base via a first hinge, and is configured to move between a released position and a clamped position. The cover piece includes a clamp portion securing the flexible interconnect circuit against the edge supports in the clamped position. A slider may be configured to move between an extended position and an inserted position within the housing chamber, and may include a convex upper surface configured to urge the flexible interconnect circuit upwards in the inserted position.

20 Claims, 17 Drawing Sheets

Related U.S. Application Data

(60) Provisional application No. 62/874,586, filed on Jul. 16, 2019.

(51) Int. Cl.
   *H01R 13/24* (2006.01)
   *H01R 13/50* (2006.01)
   *H01R 12/77* (2011.01)

(58) Field of Classification Search
   USPC .......................................... 439/495, 491, 260
   See application file for complete search history.

(56) References Cited

U.S. PATENT DOCUMENTS

| | | | | |
|---|---|---|---|---|
| 5,476,393 | A * | 12/1995 | Narita | H01R 12/88 439/495 |
| 5,901,220 | A * | 5/1999 | Garver | H04Q 1/021 379/399.01 |
| 7,682,181 | B1 * | 3/2010 | Jones, Jr. | H01R 13/639 439/352 |
| 10,153,570 | B2 | 12/2018 | Coakley et al. | |
| 10,348,009 | B2 | 7/2019 | Coakley et al. | |
| 10,446,956 | B2 | 10/2019 | Coakley et al. | |
| 10,694,618 | B2 | 6/2020 | Coakley et al. | |
| 2003/0082950 | A1 * | 5/2003 | Tang | H01R 9/0524 439/582 |
| 2006/0035515 | A1 | 2/2006 | Pabst | |
| 2006/0286859 | A1 | 12/2006 | Shimizu et al. | |
| 2007/0077814 | A1 * | 4/2007 | Sullivan | H01R 9/0515 439/581 |
| 2009/0269968 | A1 * | 10/2009 | Nemoto | H01R 12/88 439/377 |
| 2017/0331206 | A1 | 11/2017 | Manba | |
| 2019/0148857 | A1 | 5/2019 | Takase et al. | |
| 2020/0245449 | A1 | 7/2020 | Coakley et al. | |

FOREIGN PATENT DOCUMENTS

| | | |
|---|---|---|
| JP | 2002289285 A | 10/2002 |
| JP | 2002313502 A | 10/2002 |
| JP | 2005190914 A | 7/2005 |

OTHER PUBLICATIONS

International Application Serial No. PCT/US20/41829, Search Report and Written Opinion dated Oct. 15, 2020 8 pgs.

* cited by examiner

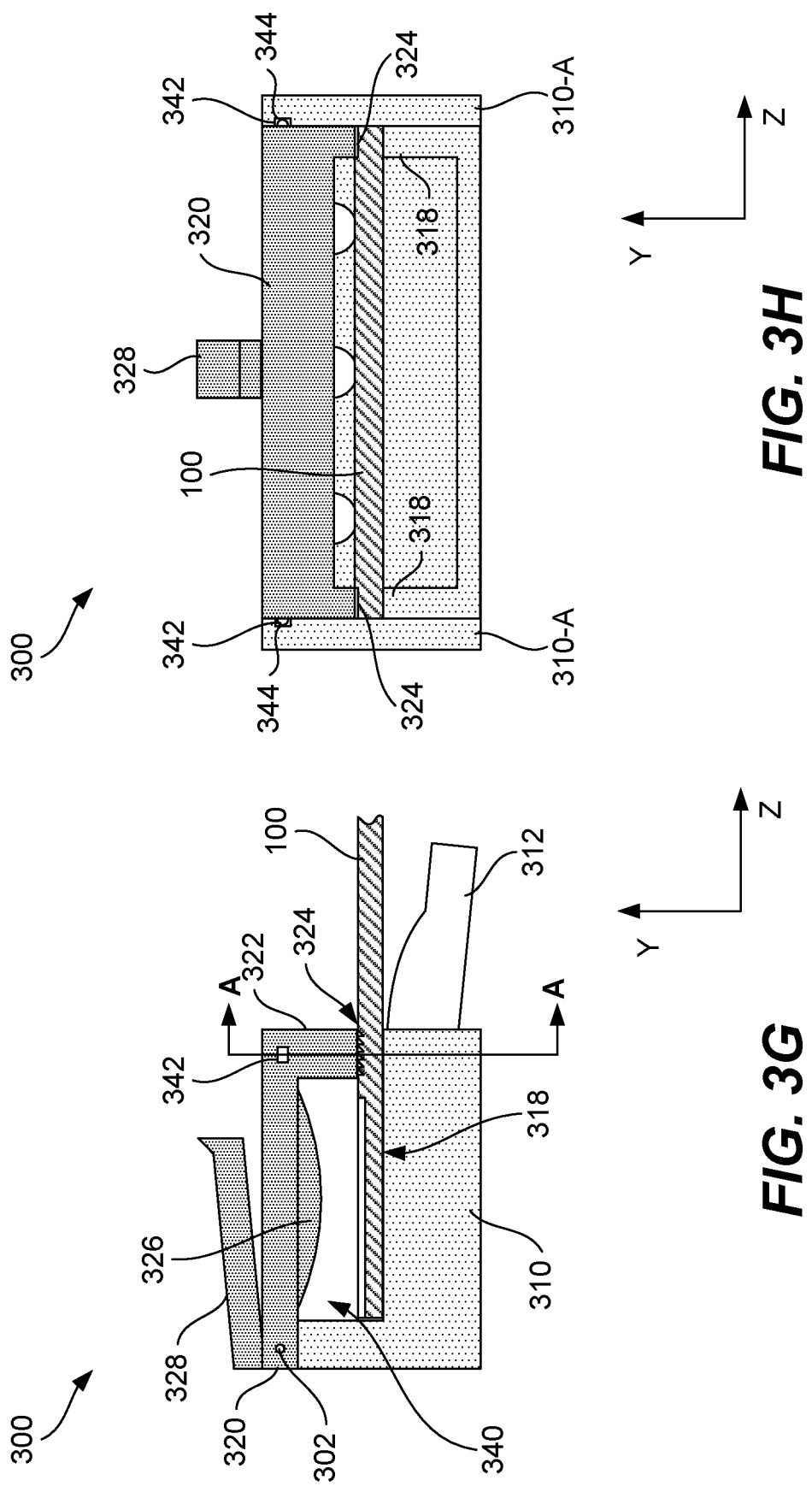

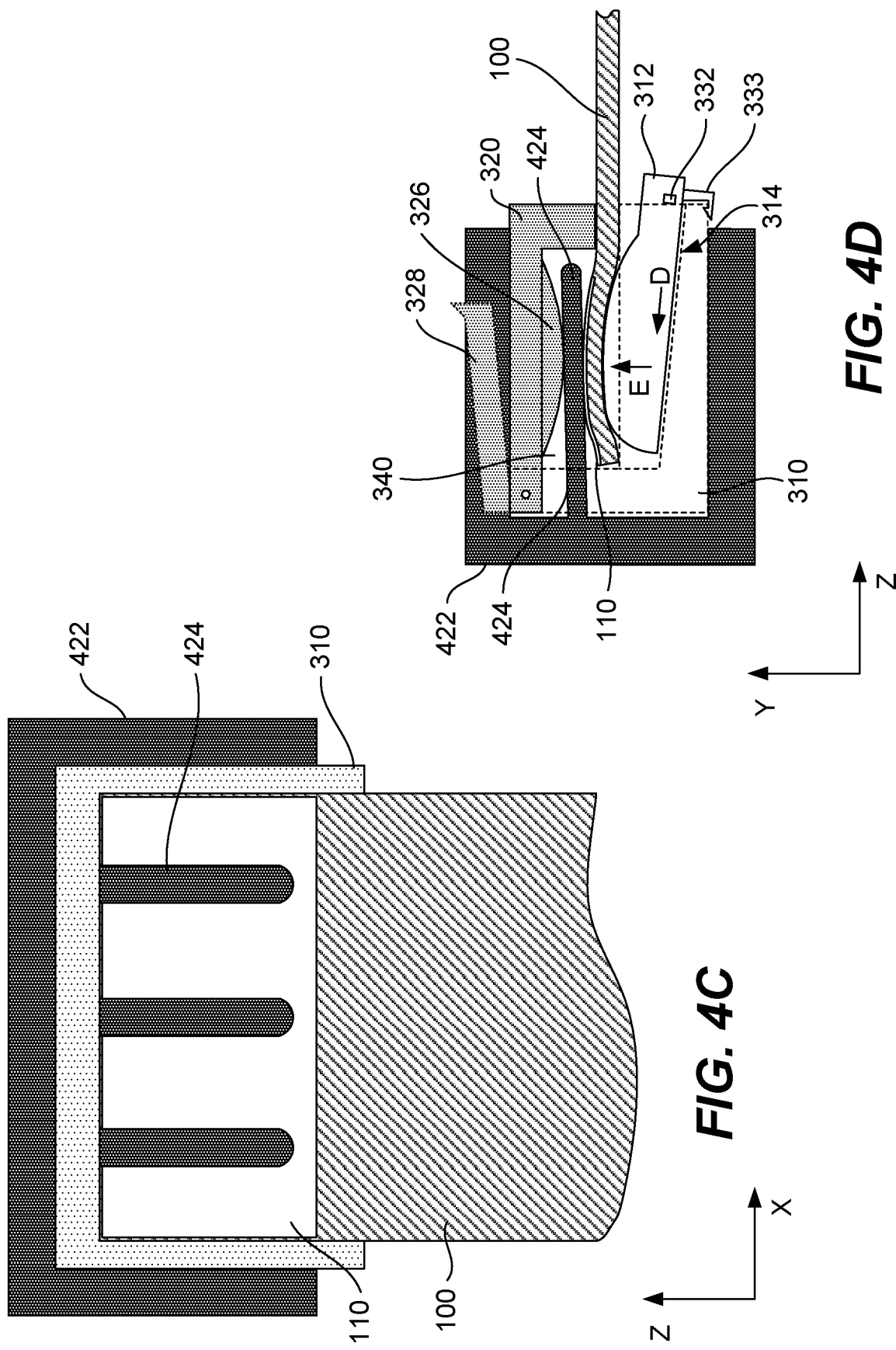

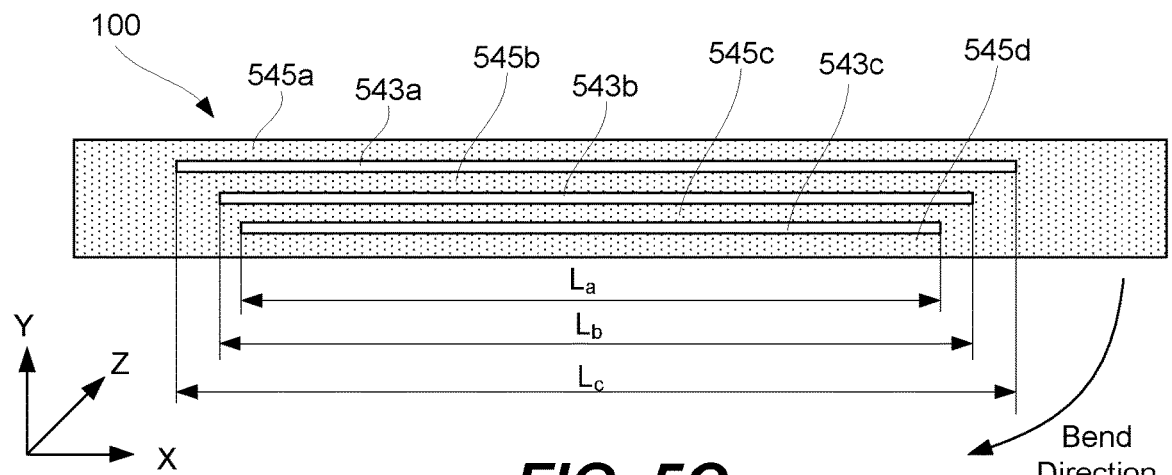
FIG. 5C
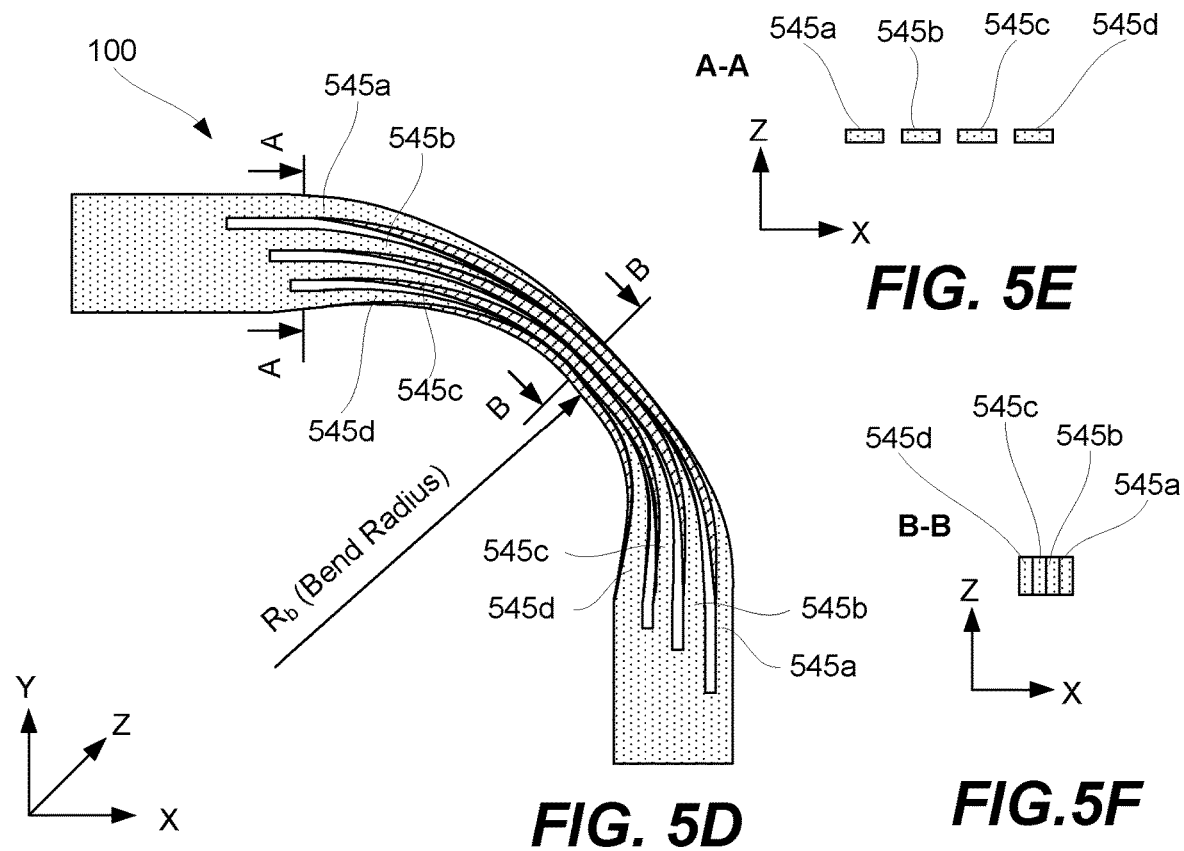
FIG. 5D
FIG. 5E
FIG. 5F

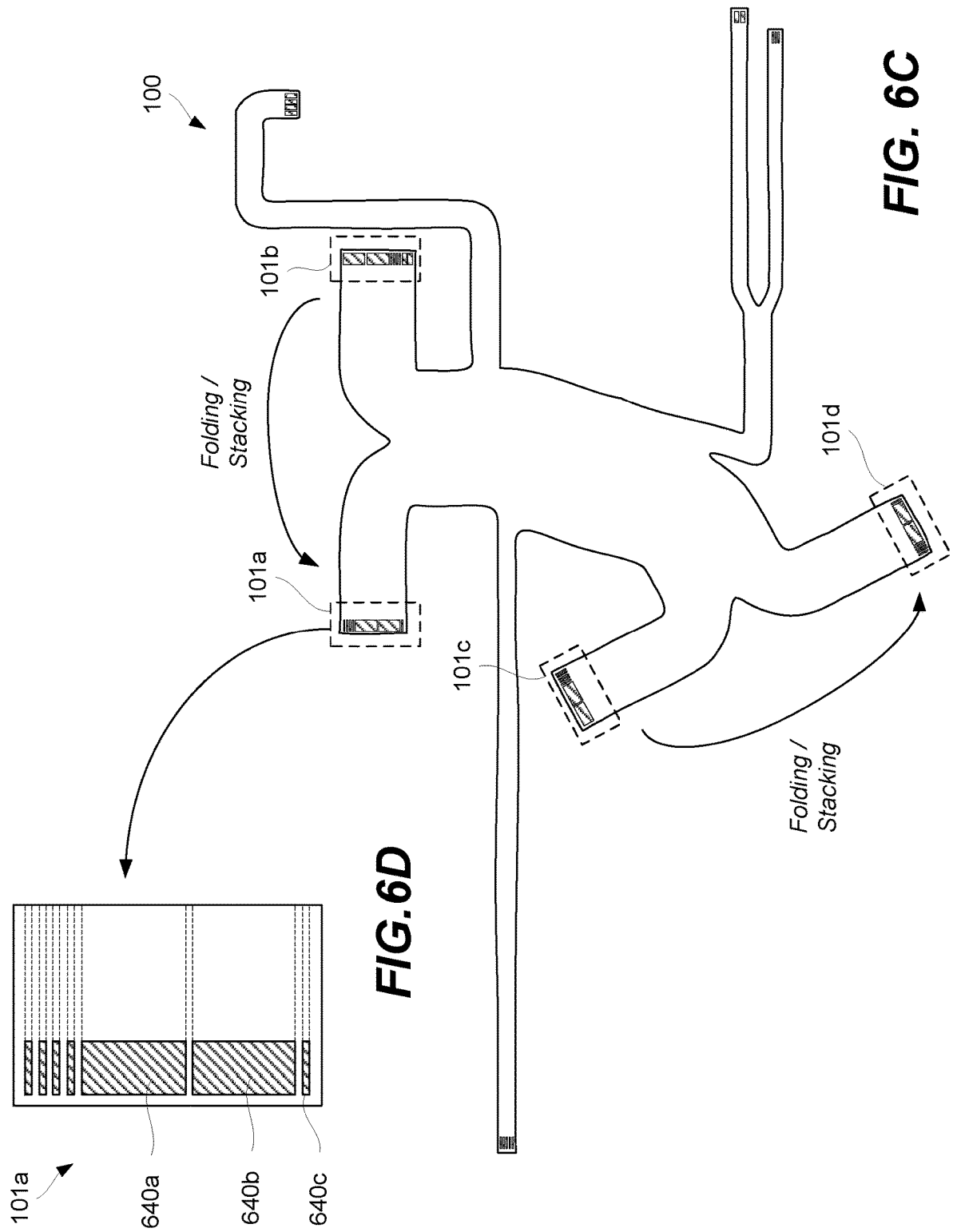

TERMINAL-FREE CONNECTORS AND CIRCUITS COMPRISING TERMINAL-FREE CONNECTORS

CROSS-REFERENCE TO RELATED APPLICATIONS

This application is a continuation of, and claims benefit under 35 U.S.C. § 120 to, International Application No. PCT/US20/41829, which claims the benefit of U.S. Provisional Application No. 62/874,586, entitled TERMINAL-FREE CONNECTORS AND CIRCUITS COMPRISING TERMINAL-FREE CONNECTORS filed on Jul. 16, 2019. These applications are incorporated by reference herein in their entirety for all purposes.

BACKGROUND

Electrical power and control signals are typically transmitted to individual components of a vehicle or any other machinery or system using multiple wires bundled together in a harness. In a conventional harness, each wire may have a round cross-sectional profile and may be individually surrounded by an insulating sleeve. The cross-sectional size of each wire is selected based on the material and current transmitted by this wire. Furthermore, resistive heating and thermal dissipation is a concern during electrical power transmission requiring even larger cross-sectional sizes of wires in a conventional harness. Additionally, traditional connectors for joining the interconnect circuits with the individual components may be rather bulky, heavy, and expensive to manufacture. Yet, automotive, aerospace and other industries strive for smaller, lighter, and less expensive components.

What is needed are terminal-free connectors and circuits comprising terminal-free connectors that are lighter and cheaper to manufacture, and which may be configured for flexible interconnect circuits that do not include traditional round cross-sectional profiles.

SUMMARY

The following presents a simplified summary of the disclosure in order to provide a basic understanding of certain s elements of this disclosure. This summary is not an extensive overview of the disclosure, and it does not identify key and critical elements of the present disclosure or delineate the scope of the present disclosure. Its sole purpose is to present some concepts disclosed herein in a simplified form as a prelude to the more detailed description that is presented later.

Provided are terminal-free connectors and circuits comprising terminal-free connectors. In particular, a connector for connecting to a flexible interconnect circuit comprises a base comprising a housing chamber defined by at least a first side wall and a second side wall. The first side wall and the second side wall are oppositely positioned about the base. The connector further comprises an edge support positioned at each of the first side wall and the second side wall. The edge supports allow for precise placement of the flexible interconnect circuit inside the housing chamber. The connector further comprises a cover piece coupled to the base via a first hinge. The cover piece is configured to move between a released position and a clamped position. The cover piece includes a clamp portion configured to secure the flexible interconnect circuit against the edge supports in the clamped position.

The first hinge may have a ball-in-socket design. The first hinge may be a living hinge formed by a region of thin and flexible plastic. The flexible interconnect circuit may be backed with pressure sensitive adhesive (PSA) to allow circuit to be tacked to the edge supports. The base may comprise one or more blade openings configured to receive blades of a module-side connector to be inserted through the one or more blade openings.

The cover piece may comprise one or more protrusions, each protrusion configured to interface with a socket within the first side wall or the second side wall to secure the cover piece in the clamped position. The cover piece may comprise a contact surface within the housing chamber in the clamped position, wherein the contact surface comprises a convex profile.

The connector may further comprise a slider configured to move between an extended position and an inserted position within the housing chamber. The slider may include a convex upper surface configured to urge the flexible interconnect circuit upwards in the inserted position. The slider may comprise a latch configured to interconnect to the base to secure the slider in the inserted position. The slider may travel between the extended position and the inserted position within a slider track in the housing chamber. The slider may comprise a protrusion configured to travel within a slider guide located within the first side wall or corresponding edge support to guide the slider between the extended position and the inserted position.

Other implementations of this disclosure include systems and methods corresponding to the described connectors. For instance, in another aspect, which may include at least a portion of the subject matter of any of the preceding and/or following examples and aspects, a system is provided which comprises a flexible interconnect circuit and a connector as described above.

These and other examples are described further below with reference to the figures.

BRIEF DESCRIPTION OF THE DRAWINGS

The disclosure may best be understood by reference to the following description taken in conjunction with the accompanying drawings, which illustrate particular examples of the present disclosure.

FIGS. 3A, 3B, 3C, 3D, 3E, 3F, 3G, and 3H illustrate various cross-sectional views of a circuit-side connector, in accordance with one or more embodiments.

FIGS. 4A, 4B, 4C, and 4D illustrate various cross-sectional views of the circuit-side connector of FIGS. 3A-3H interfacing with a module-side connector, in accordance with one or more embodiments.

FIG. 5C illustrates a schematic top view of an insulator comprising three insulator openings that divide the insulator into four insulator strips.

FIG. 5D illustrates a schematic top view of the insulator shown in FIG. 5C with one end of the insulator turned 90° relative to the other end within a plane.

FIGS. 5E and 5F illustrate schematic cross-section views of the insulator strips of the insulator shown in FIG. 5C at different locations.

FIG. 6C illustrates an example of a partially assembled electrical harness assembly having different portions that are ready to be folded and stacked together.

FIG. 6D illustrates an expanded view of a portion of the electrical harness assembly shown in FIG. 6C.

DETAILED DESCRIPTION

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific examples, it will be understood that these examples are not intended to be limiting. On the contrary, it is intended to cover alternatives, modifications, and equivalents as may be included within the spirit and scope of the present disclosure as defined by the appended claims.

FIGS. 1A, 1B, 2A, 2B, and 2C—Flexible Interconnect Circuits

Interconnect circuits are used to deliver power and/or signals and used for various applications, such as vehicles, appliances, electronics, and the like. One example of such interconnect circuits is a harness, which typically utilizes electrical conductors having round or rectangular cross-sectional profiles. In a harness, each electrical conductor may be a solid round wire or a stranded set of small round wires. A polymer shell insulates each electrical conductor. Furthermore, multiple insulated electrical conductors may form a large bundle.

Figure 1A:
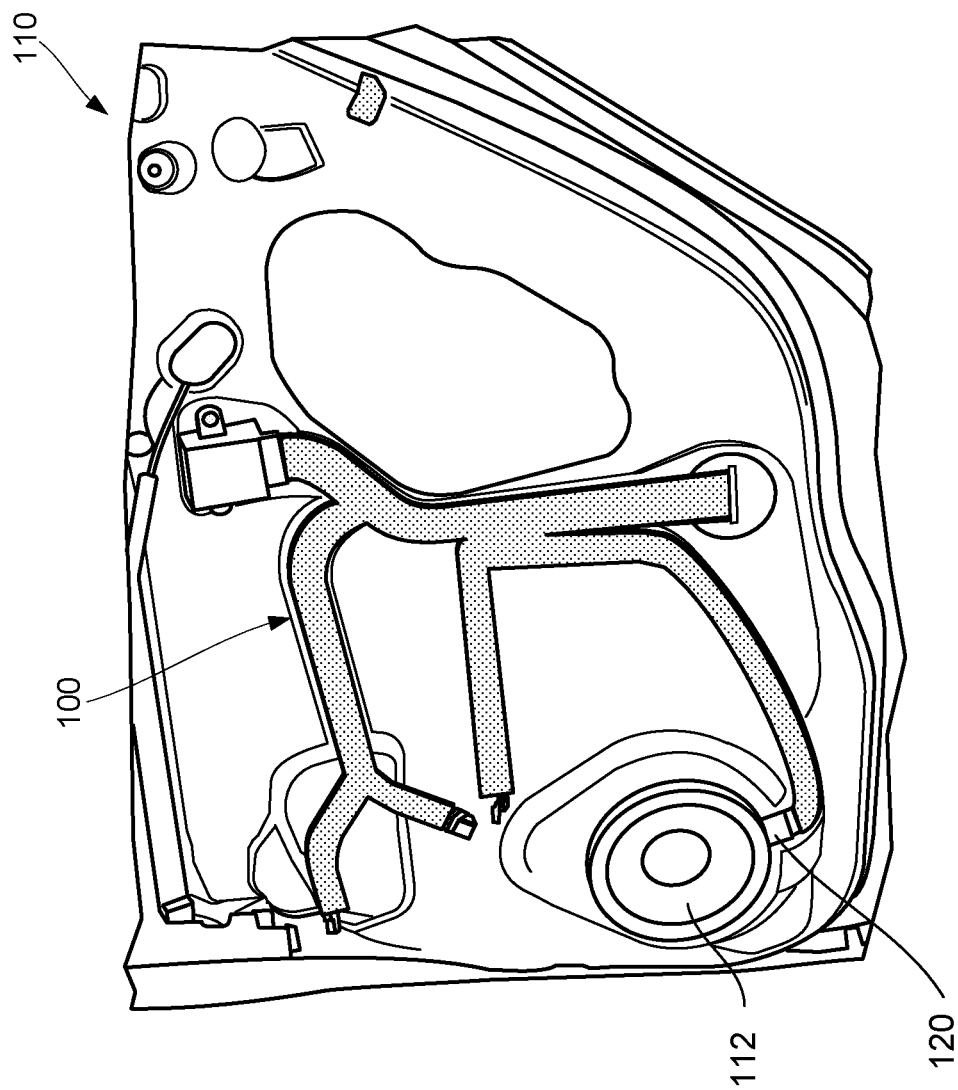
FIG. 1A is a schematic illustration of one example of a flexible hybrid interconnect circuit used in an assembly, in accordance with one or more embodiments.

FIG. 1A is a schematic illustration of one example of flexible hybrid interconnect circuit 100 used in assembly 110. As used herein, a flexible hybrid interconnect circuit may be referred to as a "flex circuit." While assembly 110 is shown as a car door, one having ordinary skill in the art would understand that various other types of vehicle panels (e.g., roof panels, floor panels) and types of vehicles (e.g., aircraft, watercraft) are also within the scope. Furthermore, flexible hybrid interconnect circuit 100 may be a part of or attached to other types of structures (e.g., battery housing), which may be operable as heat sinks or heat spreaders. For example, flexible hybrid interconnect circuit 100 may be used for various appliances (e.g., refrigerators, washers/dryers, heating, ventilation, and air conditioning), aircraft wiring, battery interconnects, and the like.

Provided are novel aspects of securing a flex circuit, such as flex circuit 100, to the male pins (also known as "blades") of an automotive connector without the need for female metal terminals within a female connector. As used herein, an automotive connector may be referred to as a "module-side connector" and a female connector may be referred to as a "circuit-side connector." The elimination of female metal terminals from the system has the potential to reduce weight, size, and cost of a flexible harness. Furthermore, in some examples, the elimination of female terminals provides a much simpler path to making a flex harness backward compatible with a round wire harness. For example, 3D printing may be used to produce a semi-custom female plastic connector that mates with a given male plastic connector.

Securing functions of the certain flex circuits described herein may be based exclusively on a plastic component (and no female metal terminals). The securing functions involve (1) securing the flexible circuit to a female connector housing, (2) securing the female connector housing to a male connector housing, and (3) securing the flex circuit to the male connector pins. Various features of flexible circuits, described herein, provide these securing functions. It should be noted that these three securing functions are provided by the same component, which may be referred to as a connector housing. In some examples, the connector housing may be an assembly of two or more plastic subcomponents.

Specifically, the connector housing forms one or more latch systems, such that each of these three securing functions is accomplished by a separate latch system. In some examples, the number of latches systems, needed to accomplish these three securing functions is two or even one.

Figure 1B:
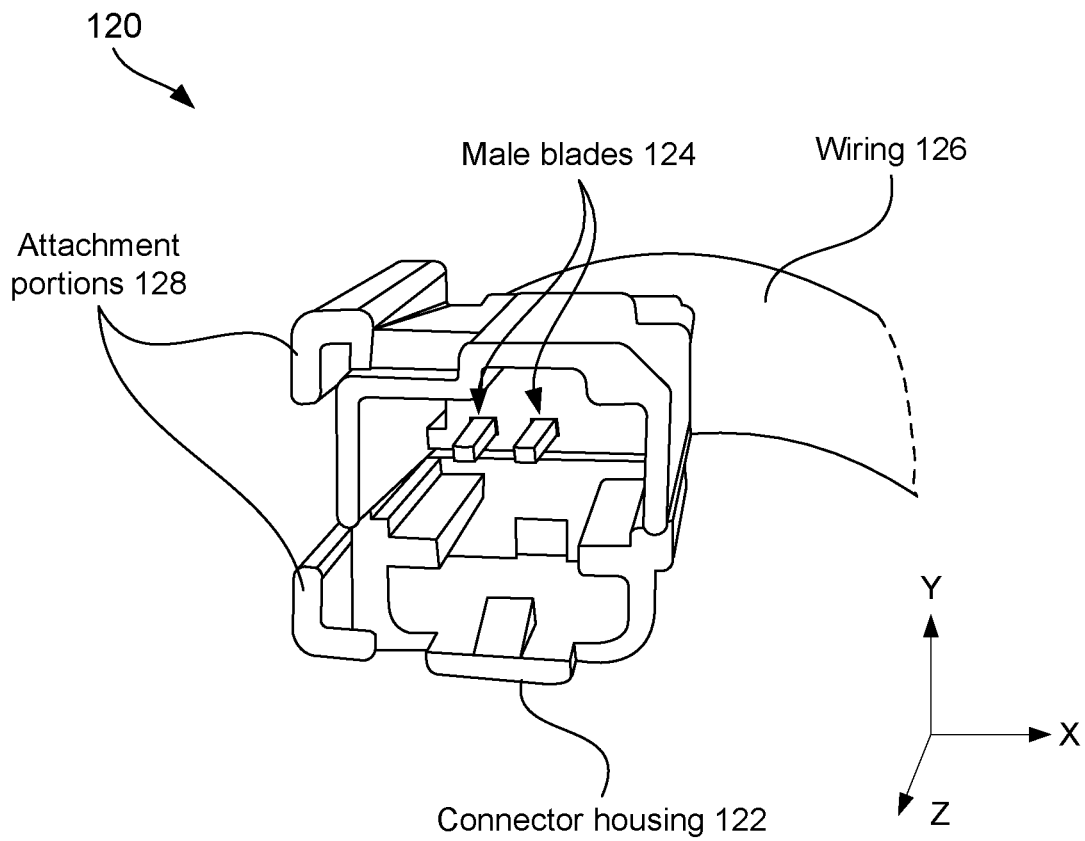
FIG. 1B is an example of a module-side connector, which may terminate wires or attach to a printed circuit board.

As an illustrative example, assembly 100 may comprise speaker system 112 which includes a module-side connector 120. FIG. 1B illustrates an example of a module-side connector, which may terminate wires 126 or be attached to a printed circuit board (PCB). Module-side connector 120 is a male connector which includes male pins or blades 124 within a module-side connector housing 122. Housing 122 may include attachment portions 128 for securing onto a structure, such as door panel. Typically, module-side connector 120 is configured to interface with a circuit-side connector such that blades 124 are inserted into female metal terminals of the circuit-side connector. In existing systems, such female metal terminals would be first coupled to a flex circuit within a circuit-side housing.

As noted above, the need to add metal terminals to flex circuits for mechanically and electrically connecting to a mating metal pin greatly increases weight, size, and costs, which substantially limits the use of various flexible circuits in automotive and other like applications. In some examples, these terminals may not be needed, because the flexible circuit traces of the flex circuit can be designed to be perfectly aligned with the male pins (aka "blades") of a module-side connector.

Described herein are methods and designs which provide the electrical and mechanical attachment of a terminal-free flexible circuit to the male blades of a mating terminal. A specially configured connector housing is used. In some examples, the connector housing is formed from one or more plastic materials described below.

It should be noted that 90% or more of all mating terminals in automotive applications use male blades. As such, the following description focuses on female connectors. However, one having ordinary skill in the art would understand that many described features are also applicable to male connectors, which are also within the scope of this disclosure.

Figure 2A:
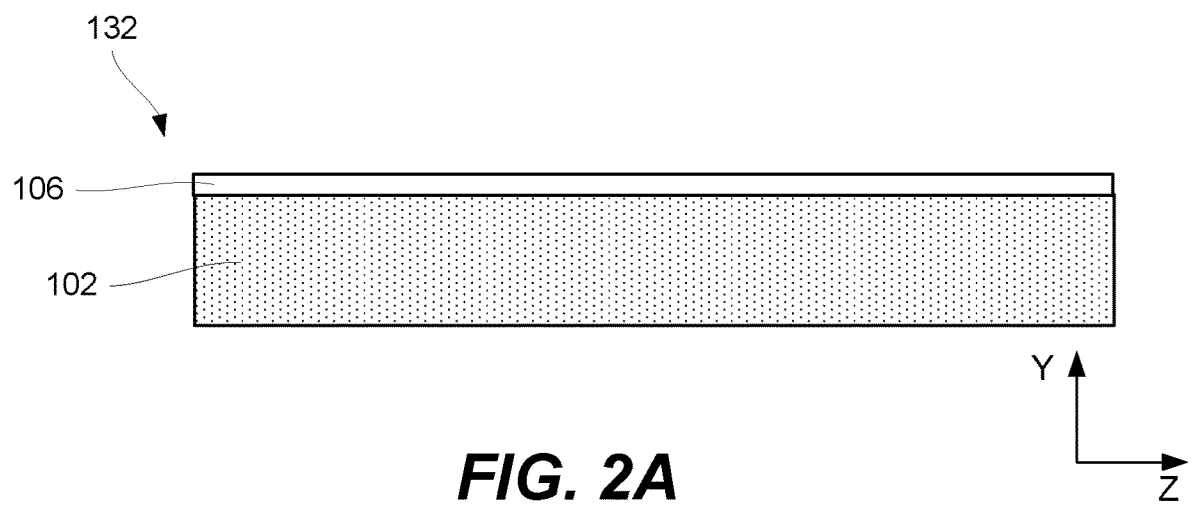
FIGS. 2A, 2B, and 2C are examples of conductive elements for use in signal transmission portions and/or power transmission portions of flexible hybrid interconnect circuits.
Figure 2B:
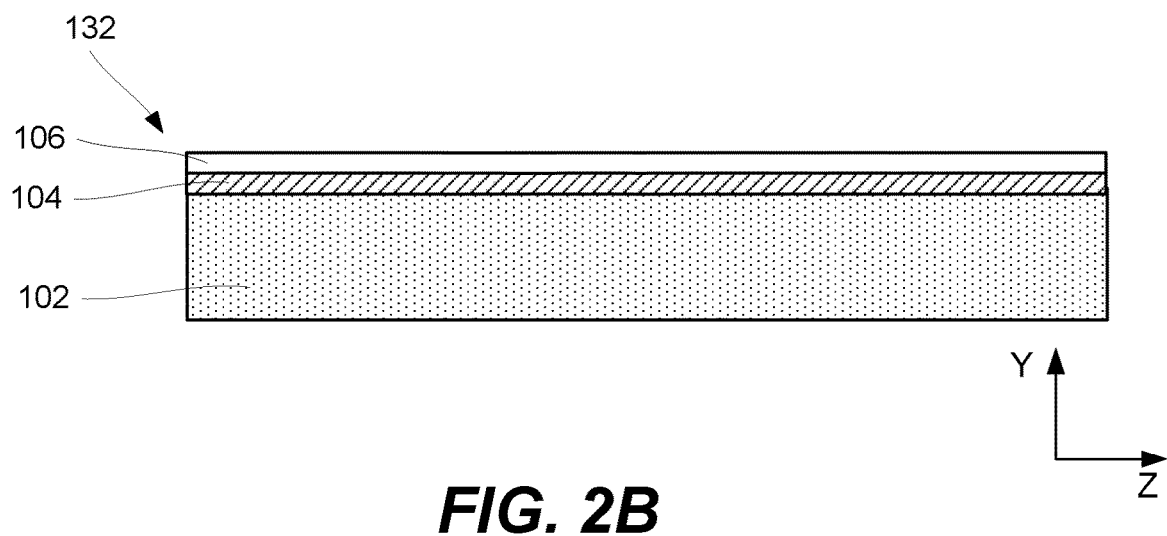
Figure 2C:
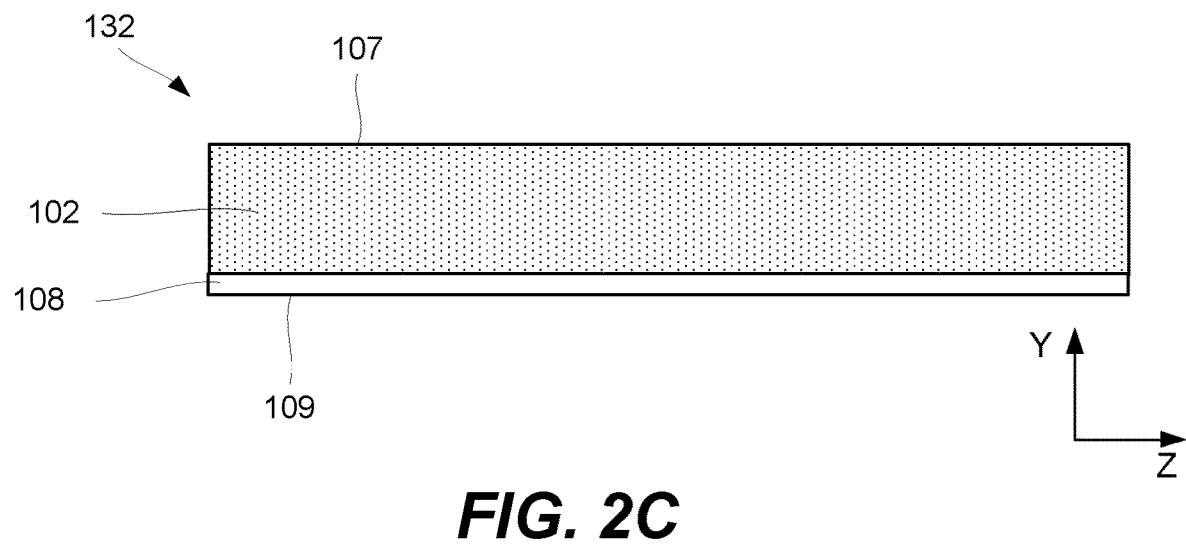

In some examples, one or more conductive elements of flexible hybrid interconnect circuit 100 comprise a base sublayer and a surface sublayer. For example, FIGS. 2A, 2B, and 2C illustrate various examples of signal line 132. However, these examples are also applicable to any other conductive element. The depicted signal line 132 may be a cross-sectional view of a flexible interconnect circuit 100. As shown in FIG. 2A, signal line 132 comprises base sublayer 102 and surface sublayer 106, such that surface sublayer 106 may have a different composition than base sublayer 102. A dielectric may be laminated over surface sublayer 106. More specifically, at least a portion of surface sublayer 106 may directly interface a dielectric (or an adhesive used for attaching these dielectrics). Surface sublayer 106 may be specifically selected to improve adhesion of the dielectric to signal line 132, and/or other purposes as described below.

Base sublayer 102 may comprise a metal selected from a group consisting of aluminum, titanium, nickel, copper, and steel, and alloys comprising these metals. The material of base sublayer 102 may be selected to achieve desired electrical and thermal conductivities of signal line 132 (or another conductive element) while maintaining minimal cost.

Surface sublayer 106 may comprise a metal selected from the group consisting of tin, lead, zinc, nickel, silver, palladium, platinum, gold, indium, tungsten, molybdenum, chrome, copper, alloys thereof, organic solderability preservative (OSP), or other electrically conductive materials. The material of surface sublayer 106 may be selected to protect base sublayer 102 from oxidation, improve surface conductivity when forming electrical and/or thermal contact to device, improve adhesion to signal line 132 (or another conductive element), and/or other purposes. Furthermore, in some examples, the addition of a coating of OSP on top of surface sublayer 106 may help prevent surface sublayer 106 itself from oxidizing over time.

For example, aluminum may be used for base sublayer 102. While aluminum has a good thermal and electrical conductivity, it forms a surface oxide when exposed to air. Aluminum oxide has poor electrical conductivity and may not be desirable at the interface between signal line 132 and other components making an electrical connection to signal line 132. In addition, in the absence of a suitable surface sublayer, achieving good, uniform adhesion between the surface oxide of aluminum and many adhesive layers may be challenging. Therefore, coating aluminum with one of tin, lead, zinc, nickel, silver, palladium, platinum, gold, indium, tungsten, molybdenum, chrome, or copper before aluminum oxide is formed mitigates this problem and allows using aluminum as base sublayer 102 without compromising electrical conductivity or adhesion between signal line 132 (or another conductive element) and other components of flexible hybrid interconnect circuit 100.

Surface sublayer 106 may have a thickness of between about 0.01 micrometers and 10 micrometers or, more specifically, between about 0.1 micrometers and 1 micrometer. For comparison, thickness of base sublayer 102 may be between about 10 micrometers and 1000 micrometers or, more specifically, between about 100 micrometers and 500 micrometers. As such, base sublayer 102 may represent at least about 90% or, more specifically, at least about 95% or even at least about 99% of signal line 132 (or another conductive element) by volume.

While some of surface sublayer 106 may be laminated to an insulator, a portion of surface sublayer 106 may remain exposed. This portion may be used to form electrical and/or thermal contacts between signal line 132 to other components.

In some examples, signal line 132 (or another conductive element) further comprises one or more intermediate sublayers 104 disposed between base sublayer 102 and surface sublayer 106 as, for example, shown in FIG. 2B. Intermediate sublayer 104 has a different composition than base sublayer 102 and surface sublayer 106. In some examples, the one or more intermediate sublayers 104 may help prevent intermetallic formation between base sublayer 102 and surface sublayer 106. For example, intermediate sublayer 104 may comprise a metal selected from a group consisting of chromium, titanium, nickel, vanadium, zinc, and copper.

In some examples, signal line 132 (or another conductive element) may comprise rolled metal foil. In contrast to the vertical grain structure associated with electrodeposited foil and/or plated metal, the horizontally-elongated grain structure of rolled metal foil may help increase the resistance to crack propagation in conductive elements under cyclical loading conditions. This may help increase the fatigue life of flexible hybrid interconnect circuit 100.

In some examples, signal line 132 (or another conductive element) comprises electrically insulating coating 108, which forms surface 109 of signal line 132, disposed opposite of conductive surface 107 as shown, for example, in FIG. 2C. At least a portion of this surface 109 may remain exposed in flexible hybrid interconnect circuit 100 and may be used for heat removal from flexible hybrid interconnect circuit 100. In some examples, the entire surface 109 remains exposed in flexible hybrid interconnect circuit 100. Insulating coating 108 may be selected for relatively high thermal conductivity and relatively high electrical resistivity and may comprise a material selected from a group consisting of silicon dioxide, silicon nitride, anodized alumina, aluminum oxide, boron nitride, aluminum nitride, diamond, and silicon carbide. Alternatively, insulating coating may comprise a composite material such as a polymer matrix loaded with thermally conductive, electrically insulating inorganic particles.

In some examples, a conductive element is solderable. When a conductive element includes aluminum, the aluminum may be positioned as base sublayer 102, while surface sublayer 106 may be made from a material having a melting temperature that is above the melting temperature of the solder. Otherwise, if surface sublayer 106 melts during circuit bonding, oxygen may penetrate through surface sublayer 106 and oxidize aluminum within base sublayer 102. This in turn may reduce the conductivity at the interface of the two sublayers and potentially cause a loss of mechanical adhesion. Hence, for many solders that are applied at temperatures ranging from 150-300° C., surface sublayer 106 may be formed from zinc, silver, palladium, platinum, copper, nickel, chrome, tungsten, molybdenum, or gold. In some examples, e.g., in cases in which a high frequency signal is to be transmitted down the signal line, the surface sublayer composition and thickness may be chosen in order minimize resistance losses due to the skin effect.

Circuit-Side Connector Examples

Figures 3A, 3B:
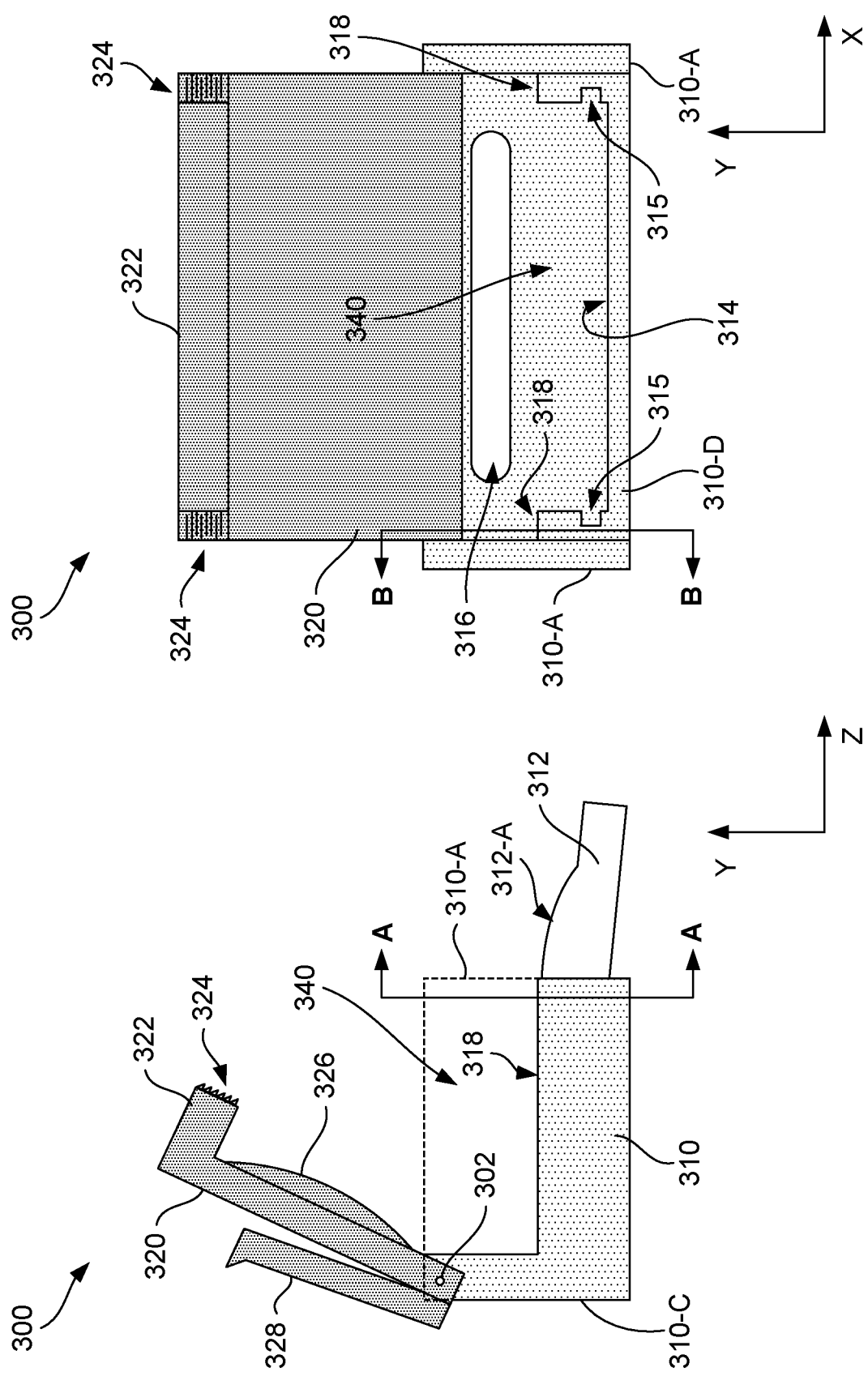
Figure 3C:
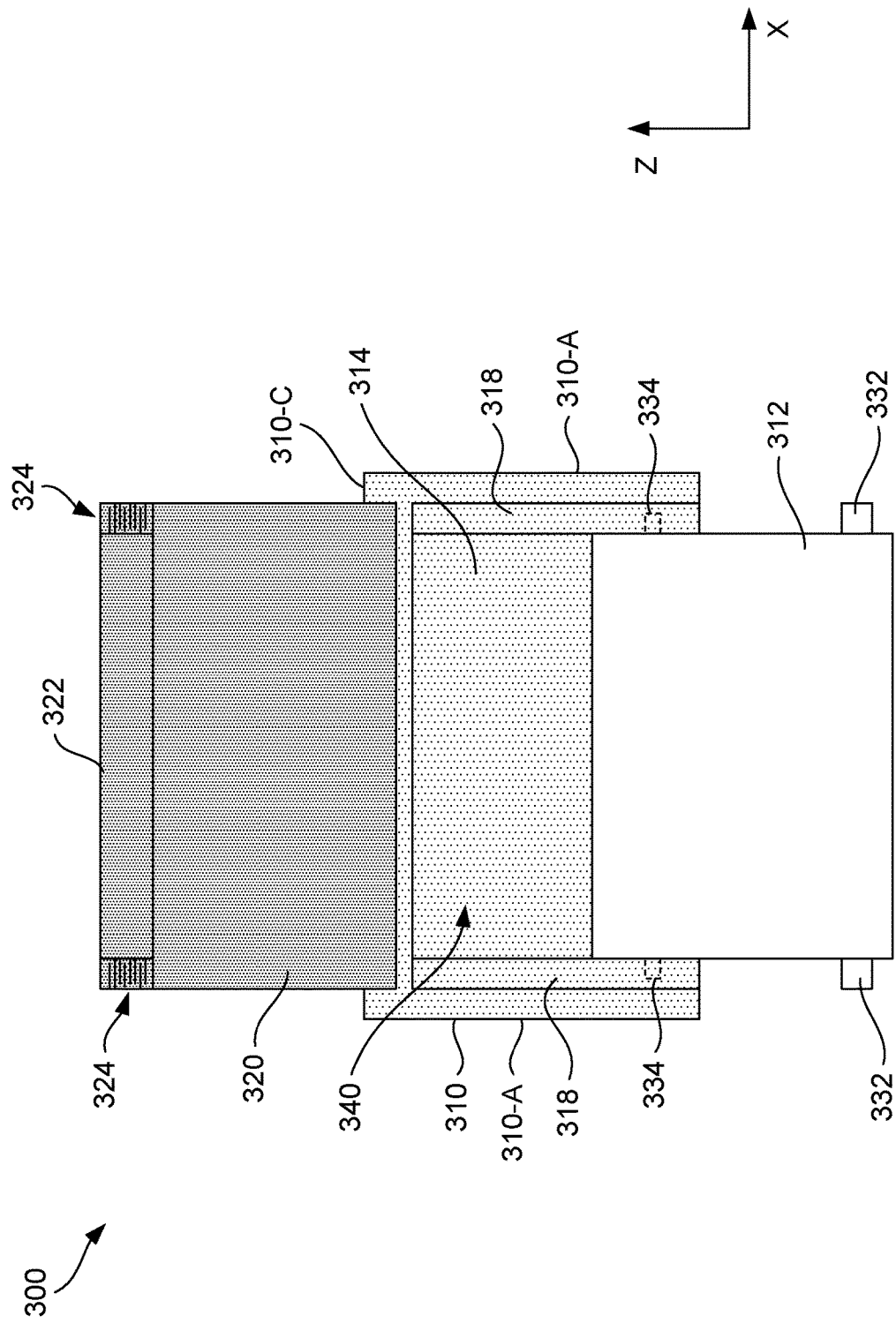

FIGS. 3A, 3B, 3C, 3D, 3E, 3F, 3G, and 3H illustrate various cross-sectional views of a circuit-side connector 300, in accordance with one or more embodiments. FIG. 3A shows a side view cross-section of connector 300 in an open and unloaded configuration from the B-B viewpoint shown in FIG. 3B. FIG. 3B shows a back view of connector 300 in the open and unloaded configuration from the A-A viewpoint shown in FIG. 3A. FIG. 3C is a top-down view of connector 300 in the open and unloaded configuration.

Specifically, connector 300 is configured with a hinge, which may be a ball-in-socket design or may simply be a region of thin, flexible plastic. The hinge allows the flex circuit to be more easily pre-loaded into the connector. In various embodiments, connector 300 comprises base 310 coupled to upper piece 320 via hinge 302. As used herein, the upper piece may be referred to as a cover piece. In some embodiments, hinge 302 may be any one of various mechanical hinge structures allowing upper piece 320 to pivot about a rotation axis centered upon hinge 302. For example, hinge 302 may be a mechanical bearing. As another example, hinge 302 may be a living hinge made from the same material as the rigid base 310 and upper piece 320. As such, base 310 and upper piece 320 may comprise a single monolithic structure.

Base 310 may be configured with blade opening 316 through which a male blade of a module-side connector may be inserted. In some embodiments, blade opening 316 may comprise a single continuous opening which allows multiple blades to pass through. In some embodiments, base 310 may include multiple blade openings, such as blade openings 316-A shown in FIG. 3E, with each blade opening 316-A corresponding to a separate male blade of the module-side connector. Blade opening or openings 316 are located on forward wall 310-C.

Base 310 may further comprise side walls 310-A (shown in dashed lines in FIG. 3A) and edge supports 318, which define a housing chamber 340 along with the floor or bottom wall 310-D of base 310. Housing chamber 340 may comprise slider track 314 positioned between edge supports 318 in which slider 312 is positioned. In some embodiments, slider 312 may include a convex upper surface 312-A. Slider 312 is not shown in FIG. 3B for visual clarity.

In some embodiments, each edge support 318 may further comprise a slider guide 315 for guiding the movement and position of slider 312. Each slider guide 315 may be a track or indented space within a corresponding edge support or base wall. In some embodiments, each slider guide 315 may be raised from the floor 310-D of based 310 as shown in FIG. 3B. However, in some embodiments, the bottom of each slider guide 315 may be flush with the floor of slider track 314. In various embodiments, protrusions 334 are positioned on each side of slider 312 (shown in FIG. 3C) and each protrusions 334 may travel within a corresponding slider guide 315. In some embodiments, slider 312 also includes one or more latches 332 for securing the slider in an inserted position (also shown in FIG. 3C).

Upper piece 320 may further comprise one or more of clamp portion 322, contact surface 326, and latch 328. Clamp portion 322 may further include grip surfaces 324 aligned with edge supports 318. In various embodiments, grip surfaces 324 may include raised, scored, or serrated structures, or may comprise various materials (such as rubber), which increase the traction or friction between the clamp portion and an opposite surface contacting the grip surfaces with applied pressure. The describe structures are configured to secure a pre-loaded flex circuit within circuit-side connector 300, as will be further explained below.

Figures 3D, 3E:
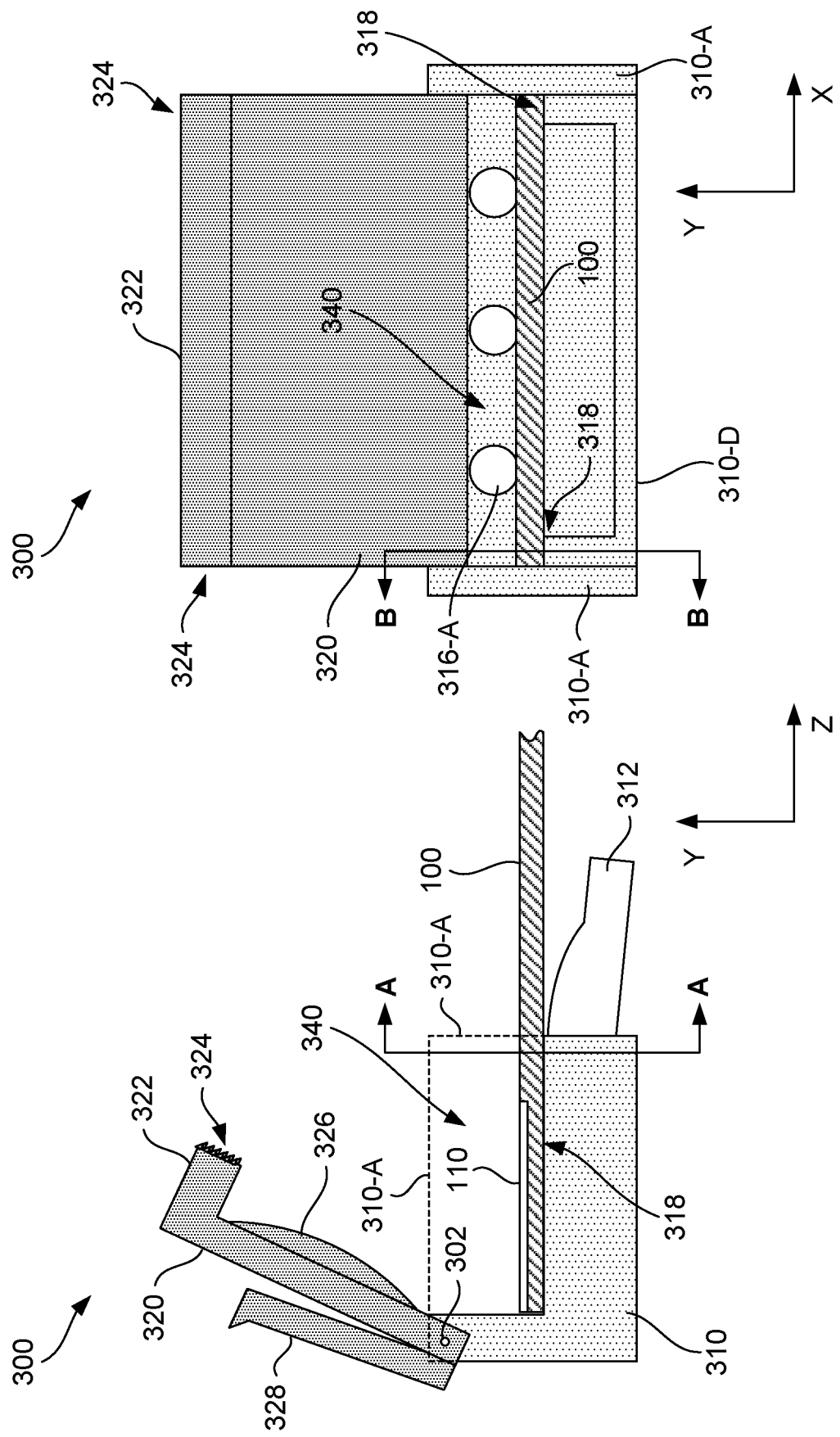
Figure 3F:
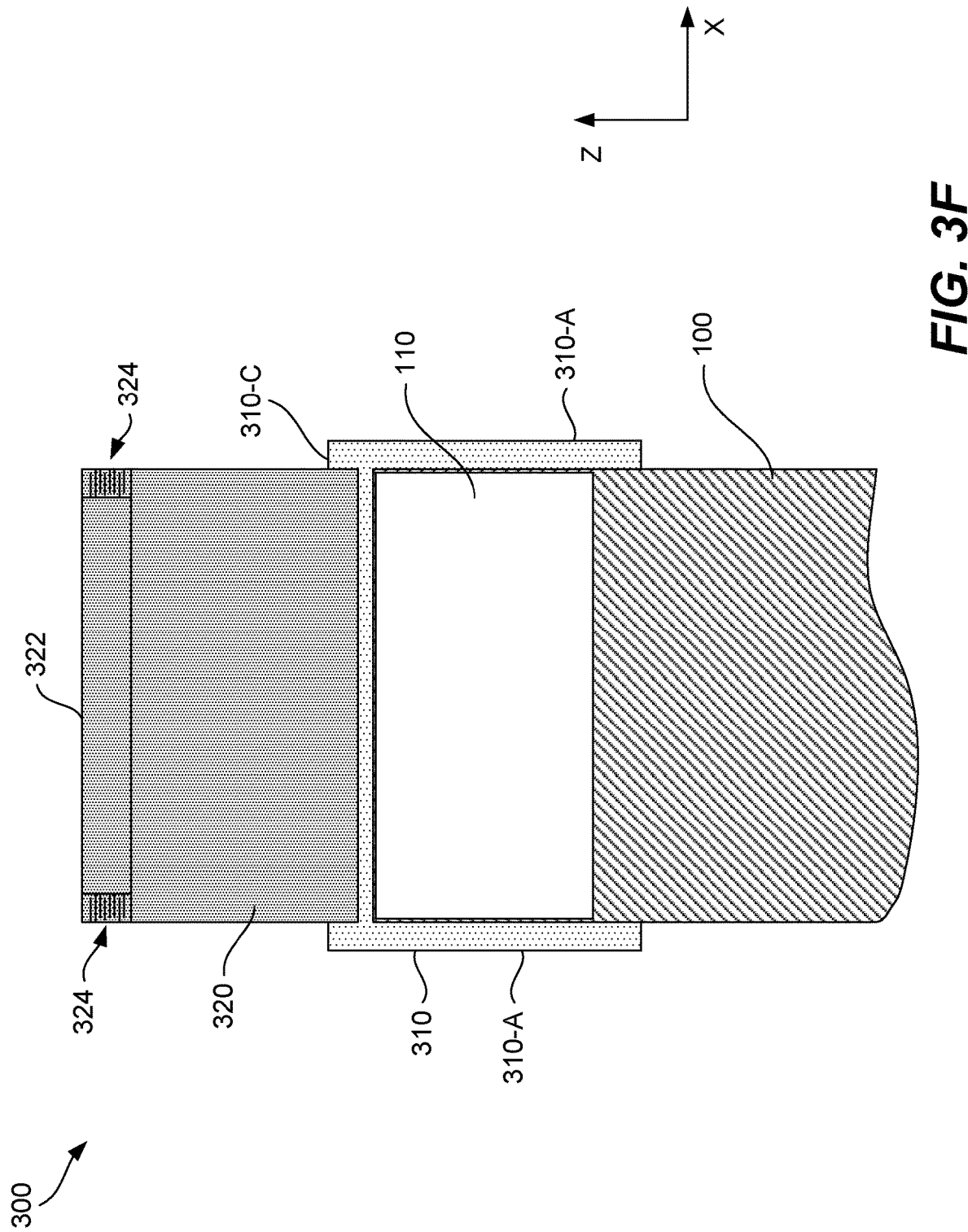

Edge supports 318 may be built into the connector and allow for the precise placement of the flex circuit 100 inside the connector. FIG. 3D shows a side view cross-section of connector 300 in an open and pre-loaded configuration from the B-B viewpoint shown in FIG. 3E. FIG. 3E shows a back view of connector 300 in the open and pre-loaded configuration from the A-A viewpoint shown in FIG. 3D. FIG. 3F is a top-down view of connector 300 in the open and pre-loaded configuration. As depicted in FIGS. 3D, 3E, and 3F, flex circuit 100 is positioned within housing chamber 340 upon edge supports 318. In some embodiments, side walls 310-A and edge supports 318 are sized accordingly with respect to the width of flex circuit 100 to allow precise placement of flex circuit 100 within housing chamber 340.

In some examples, the flex circuit may be backed with pressure sensitive adhesive (PSA) at the bottom surface to allow the flex circuit to be tacked to the connector at the edge supports. In some embodiments, flex circuit 100 may be configured with a conductive surface 110, such as described with reference to base sublayer 106. In some embodiments, the conductive surface of the flex circuit may be exposed copper or gold. Once flex circuit 100 has been pre-loaded, upper piece 320 may be placed into a closed position to cover housing chamber 340 and secure the flex circuit within. FIG. 3G shows a side-view cross-section of circuit-side connector 300 in a fully pre-loaded configuration from the B-B viewpoint. FIG. 3H shows a back view of connector 300 in the fully pre-loaded configuration from the A-A viewpoint. As shown, in the closed position, clamp portion 322 contacts flex circuit 100 and urges flex circuit 100 against edge supports 318 of base 310. This is a first securing function of the described systems.

In some embodiments, the configuration of grip surfaces 324 may apply additional force against flex circuit 100. In some embodiments, grip surfaces 324 may comprise a rough surface with a high friction coefficient. In some embodiments, the grip surfaces may include various types of corrugated or grooved surfaces. For example, the grip surfaces may include rounded ridges. In some embodiments, the grip surfaces may include sharp ridges. In some embodiments, the ridges may be angled inward toward the interior of housing chamber 340 to apply additional friction against flex circuit 100 and prevent slippage of the flex circuit out of the connector. In certain examples, sharp ridges may be configured to partially or fully puncture flex circuit to apply additional friction against flex circuit 100. The ridges may be configured with various other geometries known to prevent slippage of the flex circuit in a direction outward from the connector. In some embodiments, the grip surfaces may include materials that increase frictional interaction with the contact portion of the flex circuit. For example, grip surfaces may include rubber material. In certain embodiments, the material may depend on the material of the flex circuit. For example, a grip surface may include aluminum material to contact a flex circuit comprising aluminum to create a high coefficient of friction.

In some embodiments, upper piece 320 may include one or more protrusions 342 on each side (shown in FIGS. 3G and 3H). Protrusions 342 may be configured to fit within corresponding slots 344 within side walls 310-A. For example, as upper piece 320 is placed into the closed position, protrusions 342 may cause side walls 310-A to expand outward laterally until each protrusion is aligned and positioned within corresponding slots 344. This configuration may secure upper piece 320 in the closed position.

Alternatively, and/or additionally, latch 328 may be configured to secure upper piece 320 in the closed position. For example, latch 328 may be configured as a cam lever such as a spiral cam lever which may comprise an eccentric lever that moves along a logarithmic spiral. When rotating about a center axis, the hip cam levers may transform the rotary motion into linear motion against the upper piece in the downward direction.

Once the circuit-side connector is fully pre-loaded within the circuit-side connector housing, it may be interfaced with a module-side connector to electrically link the flex circuit with male connector blades of the module-side connector. FIGS. 4A, 4B, 4C, 4D, and 4E illustrate various cross-sectional views of a circuit-side connector 300 interfacing with a module-side connector 420, in accordance with one or more embodiments. In various embodiments, module-side connector 420 may be module-side connector 120, comprising a module-side connector housing 422 and one or more male blades 424. Male blades 424 may terminate wiring or circuitry, or may be attached to a printed circuit board. Such wiring 424-A is shown in dashed lines or omitted for clarity in the following figures.

Figure 4A:
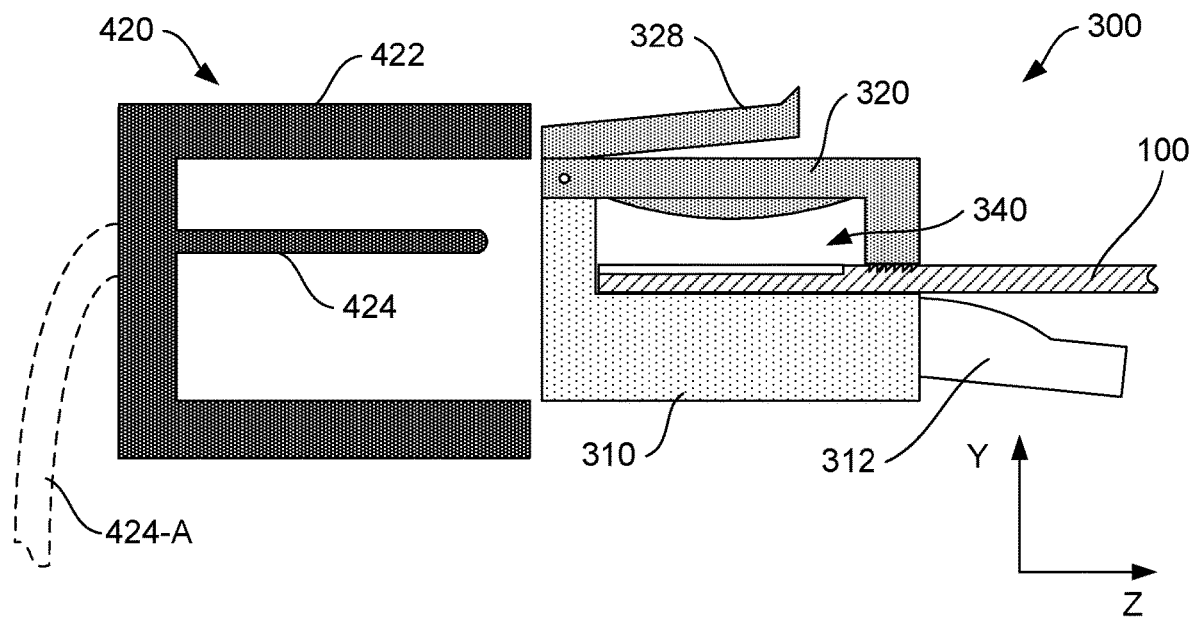
Figure 4B:
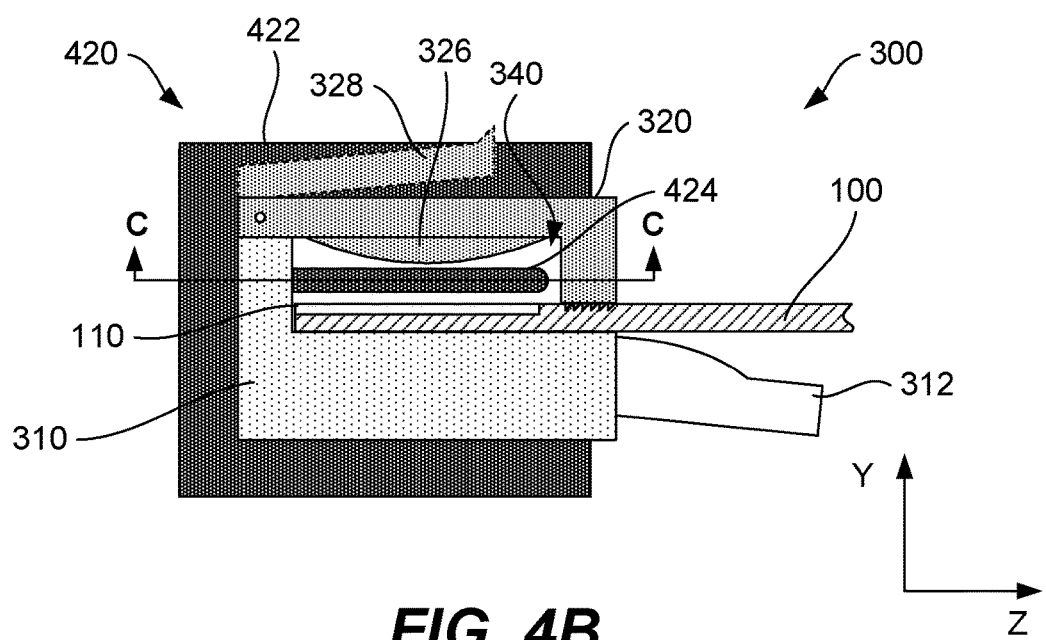

FIG. 4A shows a side view cross-section of the module-side connector 420 and circuit-side connector 300 prior to insertion. Circuit-side connector may be configured to be inserted into module-side connector housing 420, and blades 424 may be configured to be aligned with and inserted through the corresponding blade opening or openings of base 310. FIG. 4B shows a side view cross-section of circuit-side connector 300 inserted within module-side connector 420. FIG. 4C shows a top-down cross-section view of circuit-side connector 300 inserted within module-side connector 420 from the C-C viewpoint in FIG. 4B.

In some embodiments, latch 328 may be configured to secure circuit-side connector 300 within module-side connector 420. This is a second securing function of the described systems. In some embodiments, latch 328 may be configured to be drop-in compatible with existing module-side connector housing designs. However, in some embodiments, additional and/or alternative securing mechanisms may be positioned external to both connector housings. In some embodiments, insertion of the circuit-side connector into module-side connector housing 422 may further urge upper piece 320 against flex circuit 100 and edge supports 318. Once inserted, blades 424 are aligned with conductive surface 110 of the flex circuit.

At this point, blades 424 may already be sufficiently electrically coupled to the conductive surface 110 of the flex circuit. In some embodiments, contact surface 326 may include a convex geometry which urges the inserted male blades downward against the conductive surface 110 of the flex circuit. In some embodiments, slider 312 may then be inserted into housing chamber 340 to ensure or further secure the electrical coupling between blades 424 and conductive surface 110 of flex circuit 100. However, in some embodiments, contact surface 326 may not contact blades 424 until slider 312 is placed in the inserted position. In some embodiments, no electrical coupling is formed between blades 424 and conductive surface 110 until slider 312 is inserted.

FIG. 4D shows slider 312 in an inserted position. As depicted, in some embodiments, slider track 314 may include an inclined surface causing slider 312 to shift upward as it is inserted into housing chamber 340 in the direction of arrow D. This may cause the upper surface of slider 312 to urge flex circuit upward in the direction of arrow E against blades 424 causing electrical contact between blades 424 and conductive surface 110. The wedge shape of slider 312 may ensure high contact force between the flex circuit and the blades. This is a third securing function of the described systems. In some embodiments, the floor of slider track 314 may be flat and the system relies only on the wedge shape of the slider to urge the flex circuit and males blades together.

In some embodiments, this movement may also cause blades 424 to be slightly urged upward. In various embodiments, contact surface 326 of upper piece 320 is configured to contact blades 424 in order to support blades 424 against the upward movement of slider 312 and flex circuit 100, further supporting electrical contact between the blades and flex circuit. In some embodiments, flex circuit 100 may remain adhered to or in contact with edge supports 318 once slider 312 has been inserted. However, insertion of slider 312 may cause portions of the flex circuit to detach from edge supports 318.

In various embodiments, slider 312 may include latches 332 (shown in FIG. 4D) which may be configured to secure slider 312 against base 310 in the inserted position. In some embodiments, slider 312 may additionally, or alternatively, include a latch or clip 333 as a mechanism for securing slider 312 against base 310 in the inserted position. It should be understood by one of ordinary skill in the art that the various embodiments of circuit-side connectors and module-side connectors may include all or fewer features and components described herein.

Figure 4E:
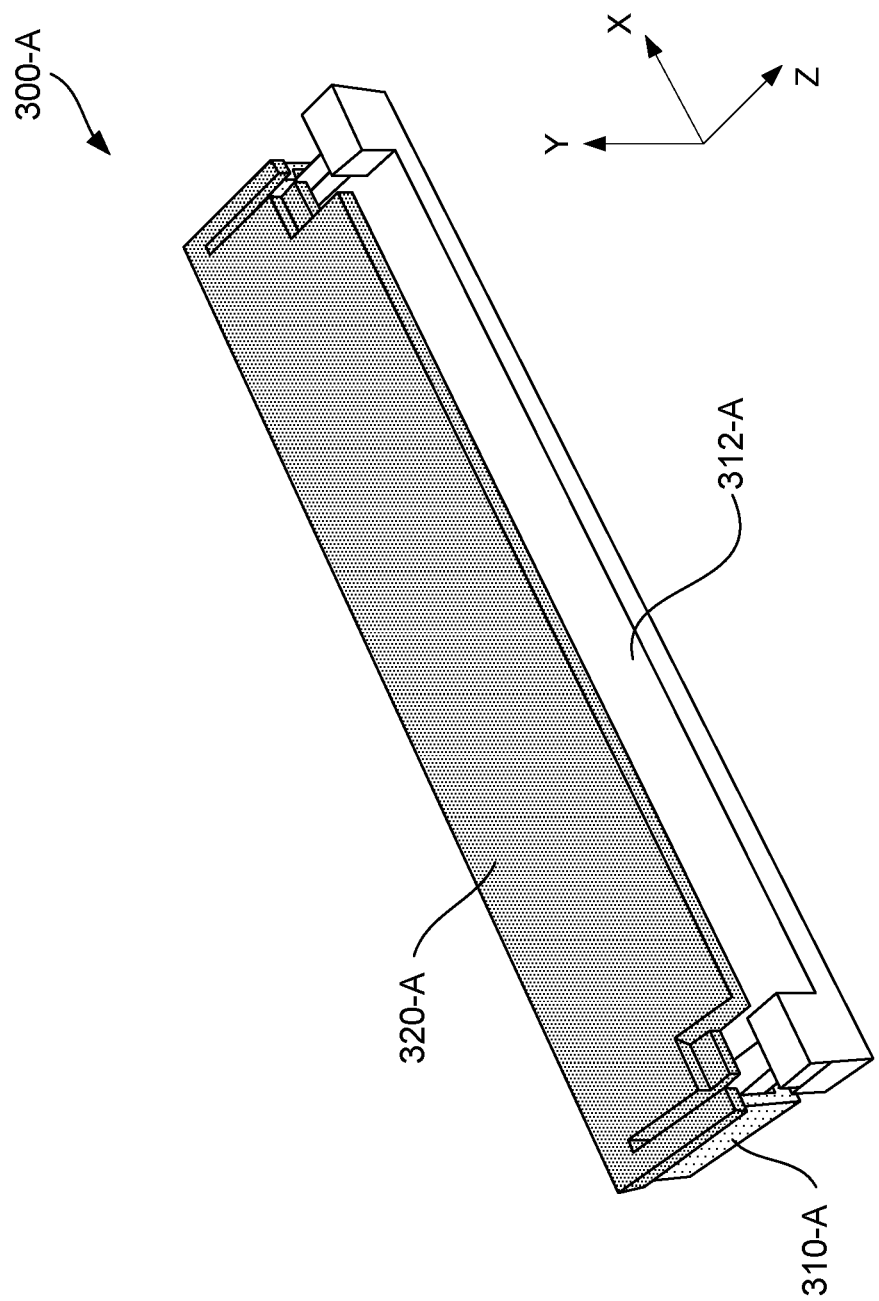
FIG. 4E is an example of a circuit-side connector housing with slider bar used for zero insertion force (ZIF) terminals, in accordance with one or more embodiments.

FIG. 4E illustrates a perspective view of another example of a circuit-side connector 300-A with a slider 312-A used for zero insertion force (ZIF) terminals, in accordance with one or more embodiments. Connector 300-A further includes base 310-A and upper portion 320-A, which may include any one or more of the features previously described with reference to connector 300. Other designs used to accomplish the three securing functions are also within the scope. It should be noted that the three securing functions themselves to be universal. For example, 3D printing may be used to adapt the shape of the female connector housing to any male connector housing.

In some examples, one or more conductive elements of flexible interconnect circuit 100 comprise a base sublayer and a surface sublayer, such that the surface sublayer has a different composition than the base sublayer. Dielectrics may be laminated over the surface sublayer. More specifically, at least a portion of the surface sublayer may directly interface the dielectric. The surface sublayer may be specifically selected to improve adhesion of dielectrics.

The base sublayer may comprise a metal selected from a group consisting of aluminum, titanium, nickel, copper, and steel, and alloys comprising these metals. The material of the base sublayer may be selected to achieve desired electrical and thermal conductivities of conductive lines (e.g., power lines and/or signal lines) while maintaining minimal cost.

The surface sublayer may comprise a metal selected from the group consisting of tin, lead, zinc, nickel, silver, palladium, platinum, gold, indium, tungsten, molybdenum, chrome, copper, alloys thereof, organic solderability preservative (OSP), or other electrically conductive materials. The material of the surface sublayer may be selected to protect the base sublayer from oxidation, improve surface conductivity when forming electrical and/or thermal contact to device, improve adhesion to conductive lines (or another conductive element), and/or other purposes.

For example, aluminum may be used for the base sublayer. While aluminum has a good thermal and electrical conductivity, it forms a surface oxide when exposed to air. Aluminum oxide has poor electrical conductivity and may not be desirable at the interface between conductive lines and other components making an electrical connection to conductive lines. In addition, in the absence of a suitable surface sublayer, achieving good, uniform adhesion between the surface oxide of aluminum and many adhesive layers may be challenging. Therefore, coating aluminum with one of tin, lead, zinc, nickel, silver, palladium, platinum, gold, indium, tungsten, molybdenum, chrome, or copper before aluminum oxide is formed mitigates this problem and allows using aluminum as the base sublayer without compromising electrical conductivity or adhesion between the conductive lines (or another conductive element) and other components of flexible hybrid interconnect circuit 100.

In some examples, conductive lines (or another conductive element) comprise an electrically insulating coating, which forms the surface of the conductive lines. At least a portion of this surface may remain exposed in flexible hybrid interconnect circuit 100 and may be used for heat removal from flexible hybrid interconnect circuit 100. In some examples, the entire surface remains exposed in flexible hybrid interconnect circuit 100. The insulating coating may be selected for relatively high thermal conductivity and relatively high electrical resistivity and may comprise a material selected from a group consisting of silicon dioxide, silicon nitride, anodized alumina, aluminum oxide, boron nitride, aluminum nitride, diamond, and silicon carbide. Alternatively, insulating coating may comprise a composite material such as a polymer matrix loaded with thermally conductive, electrically insulating inorganic particles.

In some examples, flexible interconnect circuit comprises one or more dielectrics, e.g., formed from one or more materials having a dielectric constant less than 2 or even less than 1.5. In some examples, these materials are closed cell foams. In the same or other examples, the material is dielectric crosslinked polyethylene (XLPE) or, more specifically, highly crosslinked XLPE, in which the degree of cross-linking is at least about 40%, at least about 70%, or even at least about 80%. Crosslinking prevents flowing/movement of dielectrics within the operating temperature range of flexible hybrid interconnect circuit 100, which may be between about −40° C. (−40° F.) to +105° C. (+220° F.). Conventional flexible circuits do not use XLPE primarily because of various difficulties with patterning conductive elements (by etching) against the backing formed from XLPE. XLPE is not sufficiently robust to withstand conventional etching techniques. Other suitable materials include polyethylene terephthalate (PET), polyimide (PI), or polyethylene naphthalate (PEN). In some examples, an adhesive material is a part of the dielectric, such as XDPE, low-density polyethylene (LDPE), polyester (PET), acrylic, ethyl vinyl acetate (EVA), epoxy, pressure sensitive adhesives, or the like.

FIGS. 5A-5H—Folding of the Flexible Interconnect Circuit

Figure 5A:
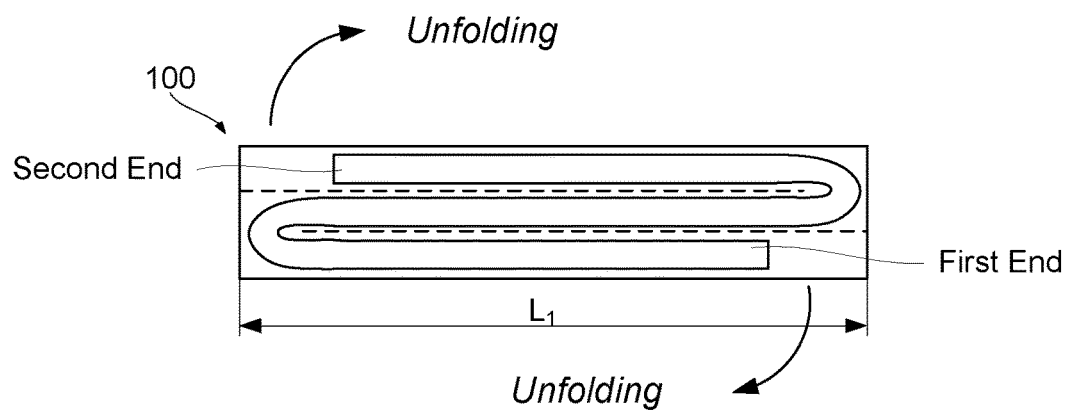
FIGS. 5A and 5B illustrate an example of unfolding a flexible hybrid interconnect circuit, in accordance with some examples.
Figure 5B:
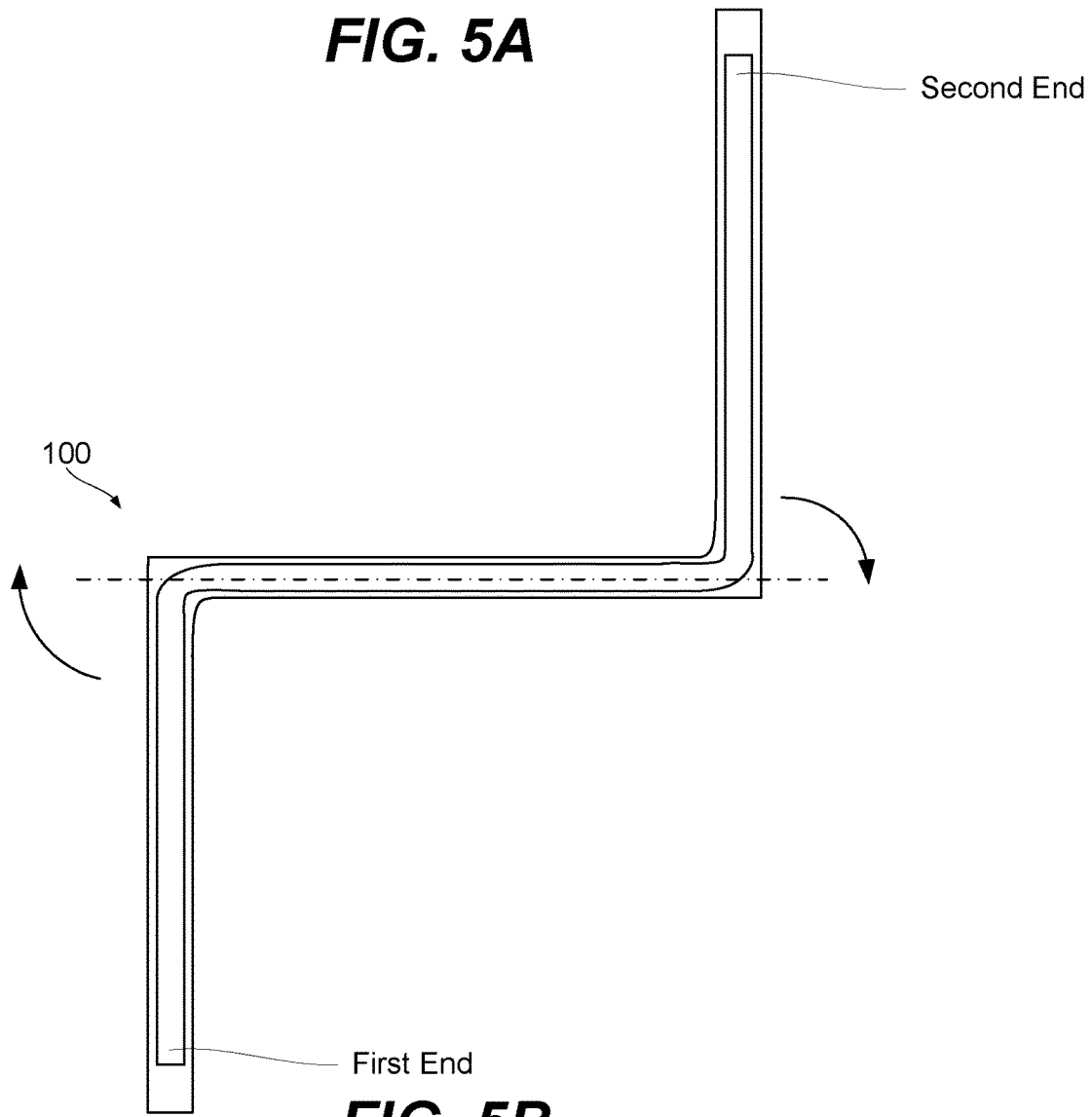

Flexible hybrid interconnect circuit 100 may be used for transmission of signals and electrical power between two distant locations. In some examples, the distance between two ends of flexible hybrid interconnect circuit 100 may be at least 1 meter or even at least 2 meters, even though the width may be relative small, e.g., less than 100 millimeters and even less than 50 millimeters. At the same time, each conductive layer of flexible hybrid interconnect circuit 100 may be fabricated from a separate metal foil sheet. To minimize material consumption and reduce waste, the manufacturing footprint of flexible hybrid interconnect circuit 100 may be smaller than its operating footprint. The flexibility characteristic of flexible hybrid interconnect circuit 100 may be used to change its shape and position after its manufacturing and/or during its manufacturing. For example, flexible hybrid interconnect circuit 100 may be manufactured in a folded state as, for example, shown in FIG. 5A. The distance between the two ends and the overall length ($L_1$) of flexible hybrid interconnect circuit 100 in the folded state may be relatively small. FIG. 5B is a schematic illustration of the same flexible hybrid interconnect circuit 100 in a partially unfolded state, showing that the distance between the two ends and the length of flexible hybrid interconnect circuit 100 has substantially increased. One having ordinary skill in the art would understand that various folding patterns are within the scope.

FIG. 5C illustrates flexible hybrid interconnect circuit 100 comprising openings 543a-543c that divide flexible hybrid interconnect circuit 100 into four strips 545a-545d. In some examples, each strip includes one or more conductor trace. FIG. 5D illustrates one end of flexible hybrid interconnect circuit 100 turned 90° relative to the other end within the X-Y plane, which may be referred to an in-plane bending. Openings 543a-543c allow flexible hybrid interconnect circuit 100 to turn and bend without significant out of plane distortions of individual strips 545a-545d. One having ordinary skills in the art would understand that such bending would be difficult without openings 543a-543c because of the flat profile of flexible hybrid interconnect circuit 100 (small thickness in the Z direction) and the relatively low in-plane flexibility of materials forming flexible hybrid interconnect circuit 100. Adding openings 543a-543c allows different routing of each of strips 545a-545d, thereby increasing flexibility and decreasing the out of plane distortion. Furthermore, selecting a particular width and length of each opening allows for specific routing and orientation of each strip and flexible hybrid interconnect circuit 100. FIGS. 5E and 5F represent cross-sections of strips 545a-545d at different locations of flexible hybrid interconnect circuit 100. As shown in these figures, strips 545a-545d may be brought closer together and rotated 90° around each of their respective center axes at some point (B-B) in the bend. To achieve this type of orientation, the length of each opening may be different or staggered as, for example, shown in FIG. 5C.

Figure 5G:
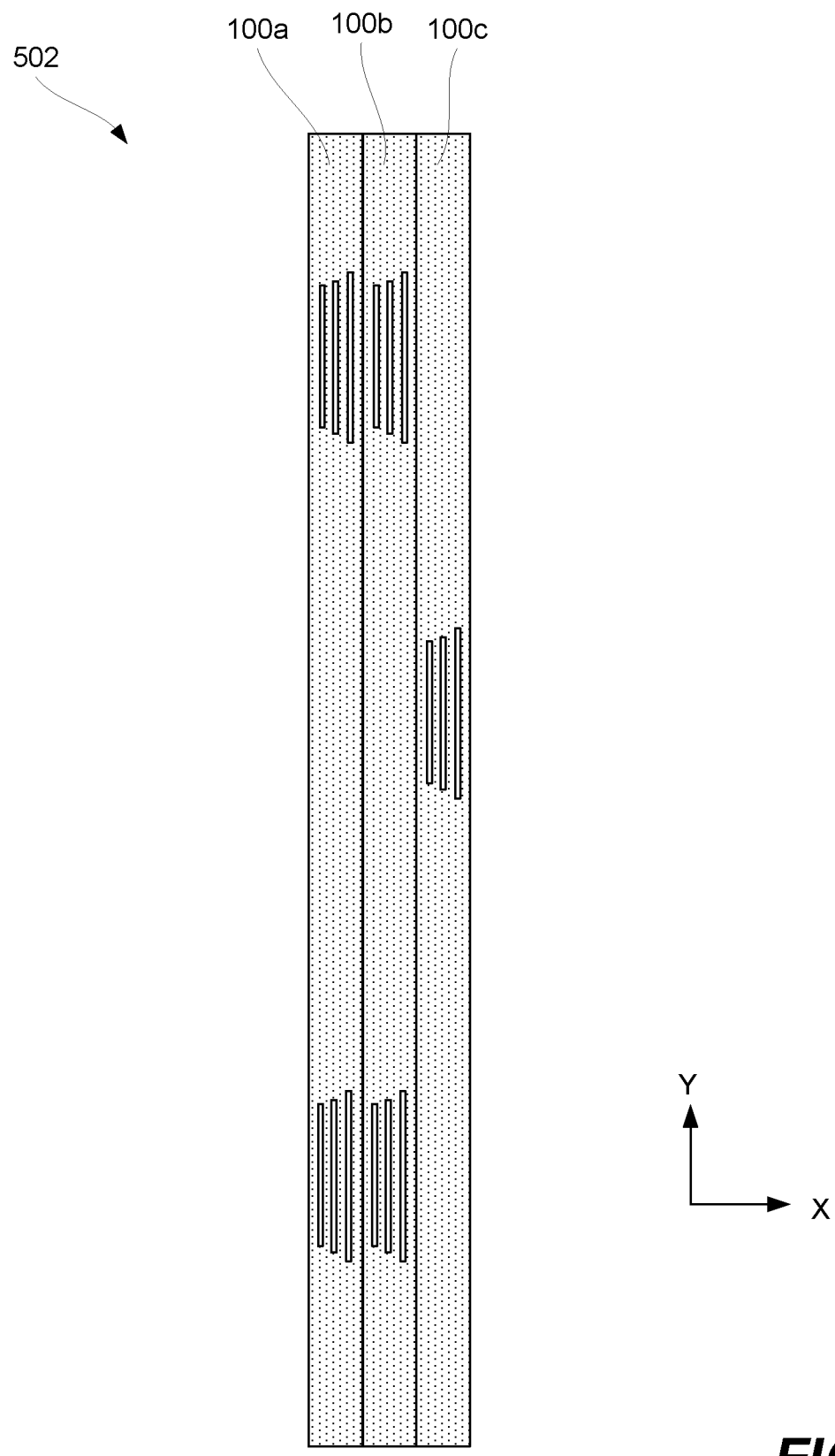
FIG. 5G illustrates an example of a production assembly of multiple flexible hybrid interconnect circuits.

FIG. 5G illustrates an example of production assembly 502 of multiple flexible hybrid interconnect circuits 100a-100c. In some examples, flexible hybrid interconnect circuits 100a-100c are partially integrated, e.g., supported on the same releasable line or have one monolithic outer dielectric layer, which is partially cut (e.g., scored). This partial integration feature allows keeping flexible hybrid interconnect circuits 100a-100c together during fabrication and storage, e.g., up to the final use of flexible hybrid interconnect circuits 100a-100c.

Furthermore, in this example, flexible hybrid interconnect circuits 100a-100c are formed in a linear form, e.g., to reduce material waste and streamline processing. Each of flexible hybrid interconnect circuits 100a-100c is separable from assembly 502 and is foldable into its operating shape, as for example, described above with reference to FIGS. 5C-10F.

Figure 5H:
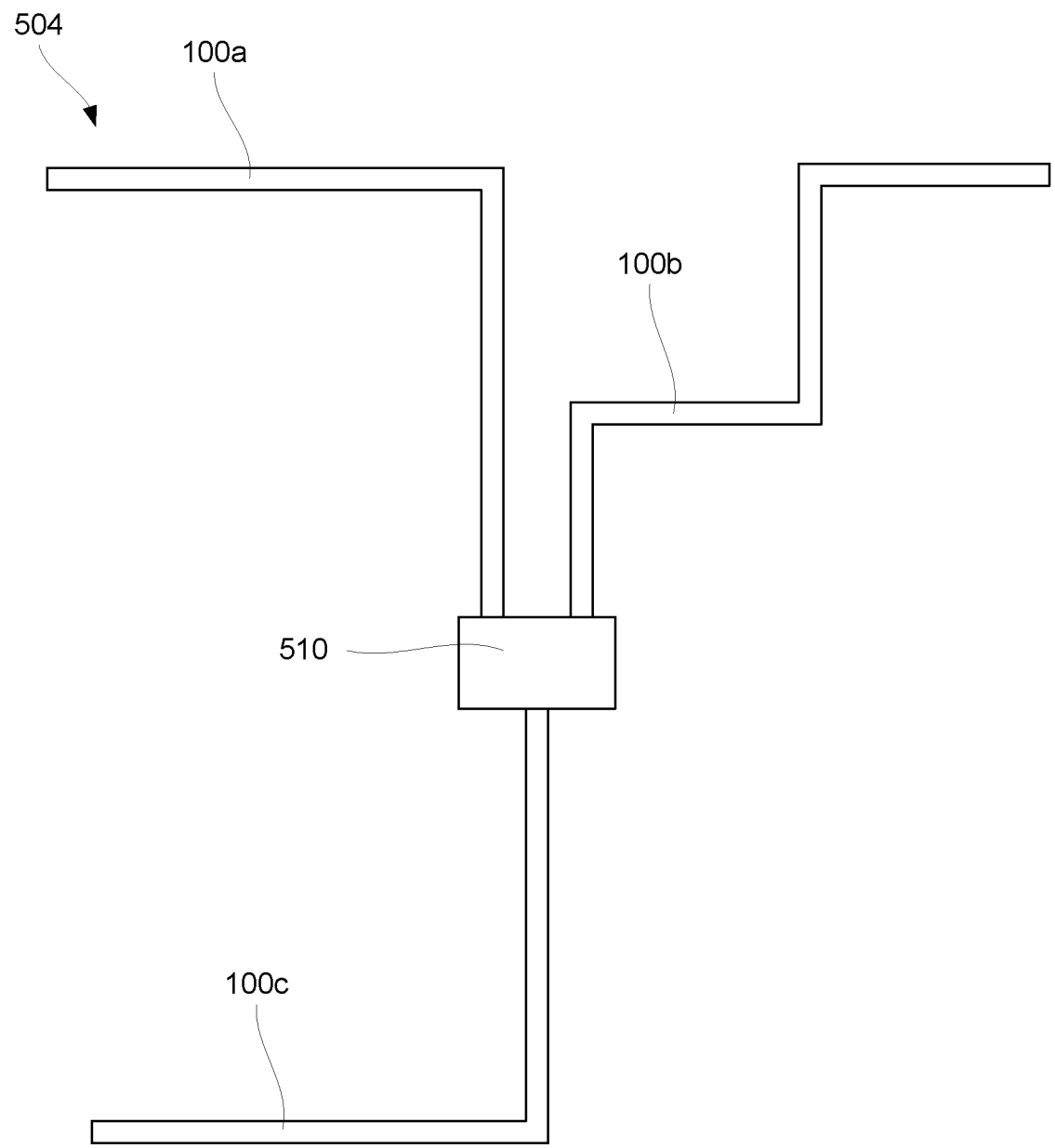
FIG. 5H illustrates of an example of an interconnect assembly comprising an interconnect hub and multiple flexible hybrid interconnect circuits.

FIG. 5H illustrates an example of interconnect assembly 504 comprising flexible hybrid interconnect circuits 100a-100c and interconnect hub 510. In some examples, each of flexible hybrid interconnect circuits 100a-100c is manufactured in a linear form as, for example, described above with reference to FIG. 5G. The bends in flexible hybrid interconnect circuits 100a-100c are formed during installation of flexible hybrid interconnect circuits 100a-100c, e.g., lamination of a supporting structure such as a car panel. Interconnect hub 510 forms electrical connections between individual conductive elements in flexible hybrid interconnect circuits 100a-100c. These electrical connections are provided by conductive elements of interconnect hub 510 positioned on one level or multiple levels (e.g., for crossover connections). Furthermore, the conductive elements of interconnect hub 510 and the conductive elements of flexible hybrid interconnect circuits 100a-100c are either within the same plane or in different planes.

FIGS. 6A-6D—Forming Connections to Flat Conductor Traces

One challenge with using flat conductor traces in a harness is forming electrical connections between such traces and other components, such as connectors and other traces/wires, which may have different dimensions or, more specifically, smaller width-to-thickness ratios. For example, connectors for wire harnesses may use contact interfaces that are square or round, or, more generally, have comparable widths and thicknesses (e.g., have a width-to-thickness ratio of about 1 or between 0.5 and 2). On the other hand, a conductor trace in a proposed flexible circuit may have a width-to-thickness ratio of at least about 2 or at least about 5 or even at least about 10. Such conductor traces may be referred to as flat conductor traces or flat wires to distinguish them from round wires. Various approaches are described herein to form electrical connections to the flat conductor traces.

Figure 6A:
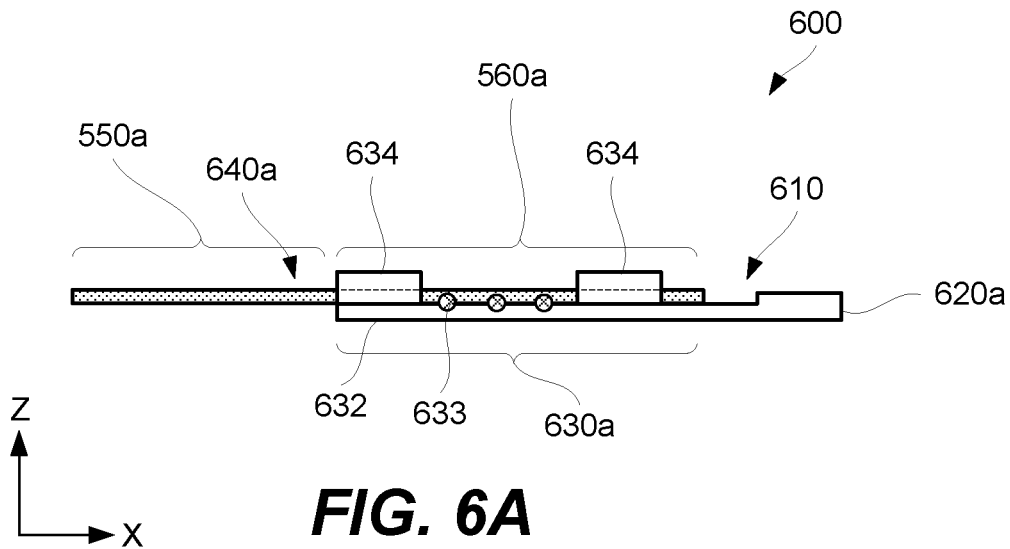
FIGS. 6A and 6B illustrate an electrical connector assembly, in accordance with some embodiments.
Figure 6B:
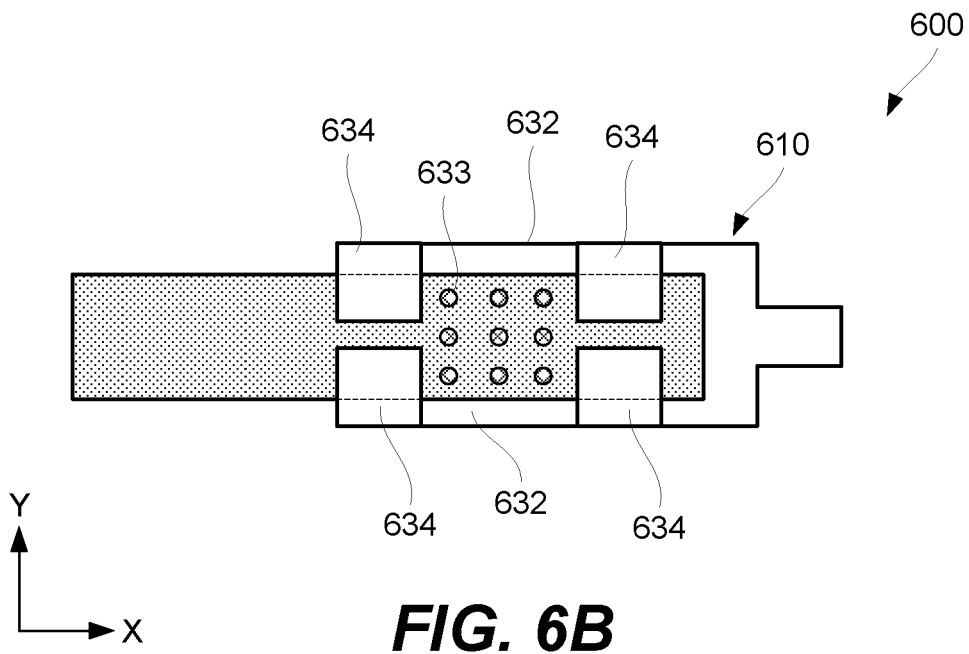

FIGS. 6A and 6B illustrate electrical connector assembly 600, in accordance with some embodiments. Electrical connector assembly 600 may be a part of electrical harness assembly 100 further described below. Electrical connector assembly 600 comprises connector 610 and conductor trace 640a, which may also be referred to as first conductor trace 640a to distinguish from other conductor traces of the same harness, if present. For simplicity, only one conductor trace is shown in these figures. However, one having ordinary skill in the art would understand that this and other examples are applicable to harnesses and connector assemblies with any number of conductor traces.

Connector 610 comprises first contact interface 620a and first connecting portion 630a. First contact interface 620a may be used to make an external connection formed by connector assembly 600 and may be in the form of a pin, socket, tab, and the like. First contact interface 620a and first connecting portion 630a may be made from the same materials (e.g., copper, aluminum, and the like). In some embodiments, first contact interface 620a and first connecting portion 630a are monolithic. For example, first contact interface 620a and first connecting portion 630a may be formed from the same strip of metal.

First conductor trace 640a comprises first conductor lead 650a and first connecting end 660a. First connecting end 660a is electrically coupled to first connecting portion 630a of connector 610. Specifically, first connecting end 660a and first connecting portion 630a may directly contact each other and overlap within the housing of connector 610.

In some embodiments, each connector is coupled to a different conductor trace. Alternatively, multiple connectors may be coupled to the same conductor trace. Furthermore, a single connector may be coupled to multiple conductor traces. Finally, multiple connectors may be coupled to multiple conductor traces such that all of these connectors and traces are electrically interconnected.

First conductor lead 650a extends away from connector 610, e.g., to another connector or forms some other electrical connection within connector assembly 600. The length of first conductor lead 650a may be at least about 100 millimeters, at least about 500 millimeters, or even at least about 3000 millimeters. First conductor lead 650a may be insulated on one or both sides using, for example, first insulator 642 and second insulator 644 as schematically shown in FIG. 20 and described below. In some embodiments, first insulator 642 and second insulator 644 do not extend to first connecting end 660a, allowing first connecting end 660a to directly interface first connecting portion 630a. Alternatively, one of first insulator 642 and second insulator 644 may overlap with first connecting portion 630a, while still exposing another side of first connecting end 660a and allowing this side to directly interface first connecting portion 630a. In some embodiments, electrical connections to first connecting portion 630a are made through openings in one of first insulator 642 and second insulator 644. In these embodiments, first insulator 642 and second insulator 644 may overlap with first connecting portion 630a. In further embodiments, external insulation to first connecting end 660a may be provided by connector 610 or by a pottant or encapsulant surrounding first connecting end 660a.

As shown in FIGS. 6A and 6B, both first conductor lead 650a and first connecting end 660a have the same thickness (e.g., formed from the same metal sheet). First connecting end 660a may have a width-to-thickness ratio of at least 0.5 or, more specifically, at least about 2 or even at least about 5 or even at least about 10. The width-to-thickness ratio of first conductor lead 650a may be the same or different.

In some embodiments, first connecting portion 630a of connector 610 comprises base 632 and one or more tabs 634. Specifically, FIG. 6B illustrates four tabs 634 extending from base 632 (two from each side of base 632). However, any number of tabs can be used. First connecting end 660a of first conductor trace 640a is crimped between base 632 and tabs 634. The crimping provides electrical connection and mechanical coupling between connecting portion 630a and first connecting end 660a. The mechanical coupling helps to ensure that the electrical coupling is retained during operation of electrical harness assembly 100. For example, the connection between first connecting portion 630a and first connecting end 660a may be subject to mechanical stresses, creeping of the material (e.g., when one or both materials comprises aluminum), and the like. Furthermore, the mechanical coupling may be used to support first connecting end 660a of first conductor trace 640a by connector 610.

In some embodiments, first connecting end 660a of first conductor trace 640a is also welded or otherwise additionally connected to base 632 as, for example, schematically shown at locations 633 in FIGS. 6A and 6B. This connection may be carried out using various means, including but not limited to ultrasonic welding, laser welding, resistance welding, brazing, or soldering. This connection helps form a low-resistance, stable electrical contact between first connecting end 660a and interfacing base 632, and may be referred to as a primary electrical connection to distinguish from the electrical connection provided by a direct interface between connector 610 and first conductor trace 640a. This primary electrical connection may comprise an intermix of materials of first connecting end 660a and interfacing base 632 and form a local monolithic structure at each location 633. Therefore, if surface oxidation or other changes in surface conditions of first connecting end 660a and interfacing base 632 happen later, these changes will not impact this primary electrical coupling between first connecting end 660a and interfacing base 632.

FIG. 6C illustrates an example of flexible hybrid interconnect circuit 100 for electrical harness assembly 110, which is only partially assembled and does not have connectors attached to its conductor traces. Flex circuit 100 comprises different portions 101a-101d, used for attachment of connectors. Prior to this attachment, various combinations of these different portions 101a-101d may be stacked together. For example, portion 101a may be stacked with portion 101b such that multiple conductor traces 640a-640c of portion 101a (shown in FIG. 6D) overlap with corresponding conductor traces of portion 101b. In a similar manner, portion 101c is ready to be stacked with portion 101d such that their corresponding conductor traces overlap. For example, portions 101a and 101b may be folded towards each other and inserted into a single connector that is able to accept and make connections to two or more rows of conductor traces. In the latter example, to prevent the conductor traces of portion 101a from inadvertently contacting portion 101b near the connector, an insulating layer may be placed in between the two portions 101a and 101b. Alternatively, portions 101a-101d or similar portions may be folded in such a way that an insulating layer, which may be also referred to as a base layer, is stacked in conductor traces on each folded end. In other words, the conductor traces remain electrically insulated even when stacked.

CONCLUSION

In the above description, numerous specific details are set forth to provide a thorough understanding of the disclosed concepts, which may be practiced without some or all of these particulars. In other instances, details of known devices and/or processes have been omitted to avoid unnecessarily obscuring the disclosure.

While the present disclosure has been particularly shown and described with reference to specific examples thereof, it will be understood by those skilled in the art that changes in the form and details of the disclosed examples may be made without departing from the spirit or scope of the present disclosure. The description of the different illustrative examples has been presented for purposes of illustration and description, and is not intended to be exhaustive or limited to the examples in the form disclosed. Many modifications and variations will be apparent to those of ordinary skill in the art. It is therefore intended that the present disclosure be interpreted to include all variations and equivalents that fall within the true spirit and scope of the present disclosure. Accordingly, the present examples are to be considered as illustrative and not restrictive.

Although many of the components and processes are described above in the singular for convenience, it will be appreciated by one of skill in the art that multiple components and repeated processes can also be used to practice the techniques of the present disclosure.

What is claimed is:

1. A connector for connecting to a flexible interconnect circuit, the connector comprising:
   a base comprising a housing chamber defined by at least a first side wall and a second side wall, wherein the first side wall and the second side wall are oppositely positioned about the base;
   an edge support positioned at each of the first side wall and the second side wall, wherein the edge supports allow for precise placement of the flexible interconnect circuit inside the housing chamber;
   a cover piece coupled to the base via a first hinge, wherein the first hinge has a ball-in-socket design, wherein the cover piece is configured to move between a released position and a clamped position, wherein the cover piece includes a clamp portion configured to secure the flexible interconnect circuit against the edge supports in the clamped position; and
   a slider configured to move between an extended position and an inserted position within the housing chamber, wherein the slider includes a convex upper surface configured to urge the flexible interconnect circuit upwards in the inserted position.

2. The connector of claim 1, wherein the clamp portion includes a grip surface configured to increase friction between the clamp portion and the flexible interconnect circuit in the clamped position.

3. The connector of claim 1, wherein the first hinge is a living hinge formed by a region of thin and flexible plastic.

4. The connector of claim 1, wherein the flexible interconnect circuit is backed with pressure sensitive adhesive (PSA) to allow circuit to be tacked to the edge supports.

5. The connector of claim 1, wherein the base comprises one or more blade openings configured to receive blades of a module-side connector to be inserted through the one or more blade openings.

6. The connector of claim 1, wherein the cover piece comprises one or more protrusions, each protrusion configured to interface with a socket within the first side wall or the second side wall to secure the cover piece in the clamped position.

7. The connector of claim 1, wherein the cover piece comprises a contact surface within the housing chamber in the clamped position, wherein the contact surface comprises a convex profile.

8. The connector of claim 1, further comprising a latch configured to secure to a module-side connector.

9. The connector of claim 1, wherein the slider comprises a latch configured to interconnect to the base to secure the slider in the inserted position.

10. The connector of claim 1, wherein the slider is configured to move between the extended position and the inserted position within a slider track in the housing chamber, and wherein the slider comprises a protrusion configured to travel within a slider guide located within the first side wall or corresponding edge support to guide the slider between the extended position and the inserted position.

11. A system comprising:
   a flexible interconnect circuit; and
   a connector comprising:
   a base comprising a housing chamber defined by at least a first side wall and a second side wall, wherein the first side wall and the second side wall are oppositely positioned about the base;
   an edge support positioned at each of the first side wall and the second side wall, wherein the edge supports allow for precise placement of the flexible interconnect circuit inside the housing chamber;
   a cover piece coupled to the base via a first hinge, wherein the first hinge has a ball-in-socket design, wherein the cover piece is configured to move between a released position and a clamped position, wherein the cover piece includes a clamp portion configured to secure the flexible interconnect circuit against the edge supports in the clamped position; and
   a slider configured to move between an extended position and an inserted position within the housing chamber, wherein the slider includes a convex upper surface configured to urge the flexible interconnect circuit upwards in the inserted position.

12. The system of claim 11, wherein the clamp portion includes a grip surface configured to increase friction between the clamp portion and the flexible interconnect circuit in the clamped position.

13. The system of claim 11, wherein the first hinge is a living hinge formed by a region of thin and flexible plastic.

14. The system of claim 11, wherein the flexible interconnect circuit is backed with pressure sensitive adhesive (PSA) to allow circuit to be tacked to the edge supports.

15. The system of claim 11, wherein the base comprises one or more blade openings configured to receive blades of a module-side connector to be inserted through the one or more blade openings.

16. The system of claim 11, wherein the cover piece comprises one or more protrusions, each protrusion configured to interface with a socket within the first side wall or the second side wall to secure the cover piece in the clamped position.

17. The system of claim 11, wherein the cover piece comprises a contact surface within the housing chamber in the clamped position, wherein the contact surface comprises a convex profile.

18. The system of claim 11, wherein the slider comprises a latch configured to interconnect to the base to secure the slider in the inserted position.

19. The system of claim 11, further comprising a latch configured to secure to a module-side connector.

20. The system of claim 11, wherein the slider is configured to move between the extended position and the inserted position within a slider track in the housing chamber, and wherein the slider comprises a protrusion configured to travel within a slider guide located within the first side wall or corresponding edge support to guide the slider between the extended position and the inserted position.

* * * * *